(12) United States Patent
Drescher et al.

(10) Patent No.: US 12,211,702 B2
(45) Date of Patent: Jan. 28, 2025

(54) SOLID BODY AND MULTI-COMPONENT ARRANGEMENT

(71) Applicant: Siltectra GmbH, Dresden (DE)

(72) Inventors: Wolfram Drescher, Dresden (DE); Marko David Swoboda, Dresden (DE); Ralf Rieske, Dresden (DE); Christian Beyer, Freiberg (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 532 days.

(21) Appl. No.: 17/207,894

(22) Filed: Mar. 22, 2021

(65) Prior Publication Data

US 2021/0225659 A1 Jul. 22, 2021

Related U.S. Application Data

(62) Division of application No. 16/467,765, filed as application No. PCT/EP2017/082468 on Dec. 12, 2017, now Pat. No. 10,978,311.

(30) Foreign Application Priority Data

Dec. 12, 2016 (DE) .......................... 102016014821.7
Nov. 7, 2017 (DE) .......................... 102017010284.8

(51) Int. Cl.
*H01L 29/16* (2006.01)
*H01L 21/02* (2006.01)
(Continued)

(52) U.S. Cl.
CPC ...... *H01L 21/324* (2013.01); *H01L 21/02354* (2013.01); *H01L 21/02422* (2013.01); *H01L 21/304* (2013.01); *H01L 29/66053* (2013.01)

(58) Field of Classification Search
CPC ... H01L 21/78; H01L 29/1608; H01L 21/304; H01L 21/76254; H01L 21/6835; H01L 21/02433; H01L 21/02529
See application file for complete search history.

(56) References Cited

U.S. PATENT DOCUMENTS 5,148,446 A 9/1992 Radich
6,787,732 B1 9/2004 Xuan et al.
(Continued)

FOREIGN PATENT DOCUMENTS

CN 1998071 A 7/2007
CN 101048255 A 10/2007
(Continued)

*Primary Examiner* — Kretelia Graham
*Assistant Examiner* — David J Goodwin
(74) *Attorney, Agent, or Firm* — Murphy, Bilak & Homiller, PLLC

(57) ABSTRACT

A solid body is disclosed. The solid body includes: a detachment plane in an interior space of the solid body, the detachment plane including laser radiation-induced modifications; and a region including layers and/or components. A multi-component arrangement is also disclosed. The multi-component arrangement includes: a solid-body layer including more than 50% SiC and modifications or modification components generating pressure tensions in a region of a first surface, the modifications being amorphized components of the solid-body layer, the modifications being spaced closer to the first surface than to a second surface opposite the first surface, the first surface being essentially level; and a metal layer on the first surface of the solid-body layer.

16 Claims, 10 Drawing Sheets

(51) Int. Cl.
  *H01L 21/304* (2006.01)
  *H01L 21/324* (2006.01)
  *H01L 29/66* (2006.01)

(56) References Cited

U.S. PATENT DOCUMENTS

| | | | |
|---|---|---|---|
| 7,763,541 | B2 | 7/2010 | Okuda et al. |
| 10,576,585 | B1 | 3/2020 | Donofrio et al. |
| 11,034,056 | B2* | 6/2021 | Bubel ............... H01L 29/1608 |
| 2003/0197909 | A1 | 10/2003 | Beyer et al. |
| 2005/0048738 | A1 | 3/2005 | Shaheen et al. |
| 2006/0258047 | A1 | 11/2006 | Nishiwaki et al. |
| 2007/0020884 | A1 | 1/2007 | Wang et al. |
| 2008/0265379 | A1* | 10/2008 | Brandes ............. H01S 5/32341 257/E21.108 |
| 2009/0242010 | A1 | 10/2009 | Herner |
| 2009/0242913 | A1* | 10/2009 | Kim .................. H01L 33/34 257/E33.061 |
| 2010/0289189 | A1 | 11/2010 | Lichtensteiger et al. |
| 2011/0039356 | A1* | 2/2011 | Ando .................... B32B 38/10 257/E21.53 |
| 2012/0234887 | A1 | 9/2012 | Henley et al. |
| 2013/0180665 | A2 | 7/2013 | Gomez et al. |
| 2013/0248500 | A1 | 9/2013 | Shreter et al. |
| 2013/0292691 | A1 | 11/2013 | Henley et al. |
| 2013/0344686 | A1 | 12/2013 | Fukuyo et al. |
| 2014/0030836 | A1* | 1/2014 | Murali ................ H01L 33/0093 257/E33.013 |
| 2014/0038392 | A1* | 2/2014 | Yonehara ........... H01L 33/0093 438/463 |
| 2014/0197419 | A1 | 7/2014 | Henley et al. |
| 2015/0340541 | A1 | 11/2015 | Koehler et al. |
| 2016/0254232 | A1 | 9/2016 | Drescher et al. |
| 2018/0277515 | A1 | 9/2018 | Homma et al. |
| 2019/0084080 | A1 | 3/2019 | Fujita et al. |
| 2019/0088624 | A1 | 3/2019 | Kurosawa et al. |

FOREIGN PATENT DOCUMENTS

| | | |
|---|---|---|
| CN | 102271858 | 12/2011 |
| CN | 102325717 | 1/2012 |
| CN | 103380482 A | 10/2013 |
| CN | 103459082 A | 12/2013 |
| CN | 103814436 A | 5/2014 |
| CN | 107820453 A | 3/2018 |
| DE | 102012001620 A1 | 8/2013 |
| DE | 102013007672 A1 | 11/2014 |
| DE | 102014214940 A1 | 2/2015 |
| DE | 102014014486 A1 | 4/2015 |
| DE | 102014002600 A1 | 8/2015 |
| DE | 102015217288 A1 | 3/2016 |
| DE | 102015004603 A1 | 10/2016 |
| EP | 1806202 A1 | 7/2007 |
| FR | 2980279 A1 | 3/2013 |
| JP | 2005277136 A | 10/2005 |
| JP | 2006245498 A | 9/2006 |
| JP | 2007142114 A | 6/2007 |
| JP | 2009061462 A | 3/2009 |
| JP | 2009140958 A | 6/2009 |
| JP | 2009140959 A | 6/2009 |
| JP | 2012109341 A | 6/2012 |
| JP | 2013158778 A | 8/2013 |
| JP | 2013161820 A | 8/2013 |
| JP | 2013223886 A | 10/2013 |
| JP | 2014527709 A | 10/2014 |
| JP | 2015516672 A | 6/2015 |
| JP | 2016015463 A | 1/2016 |
| JP | 2016509364 A | 3/2016 |
| JP | 2016043558 A | 4/2016 |
| JP | 2016197699 A | 11/2016 |
| KR | 20130100491 A | 9/2013 |
| KR | 20130143433 A | 12/2013 |
| KR | 20140062428 A | 5/2014 |
| TW | 200933703 A | 8/2009 |
| WO | 2010072675 A2 | 7/2010 |
| WO | 2012108056 A1 | 8/2012 |
| WO | 2013084877 A1 | 6/2013 |
| WO | 2014177721 A1 | 11/2014 |
| WO | 2016055443 A1 | 4/2016 |

* cited by examiner

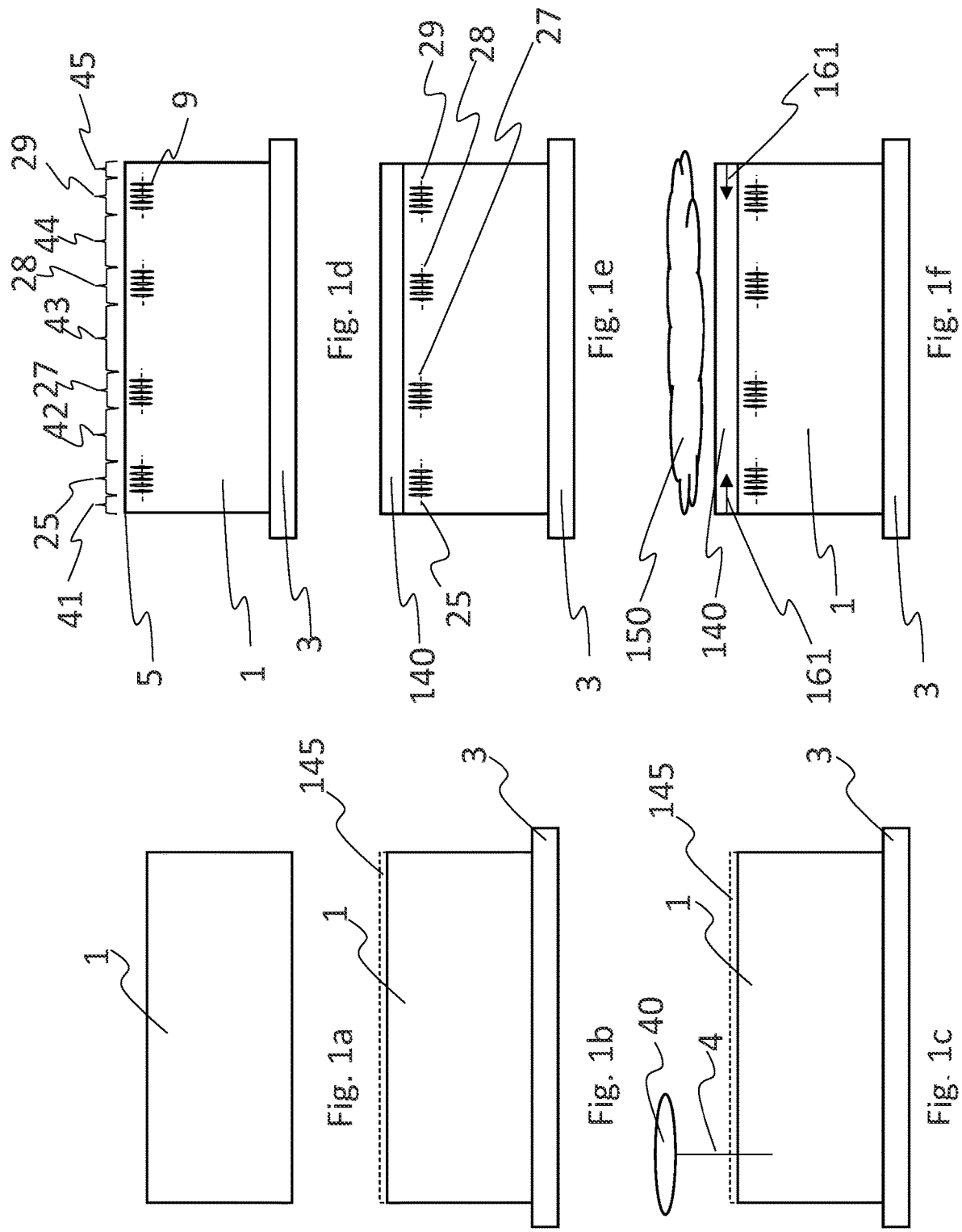

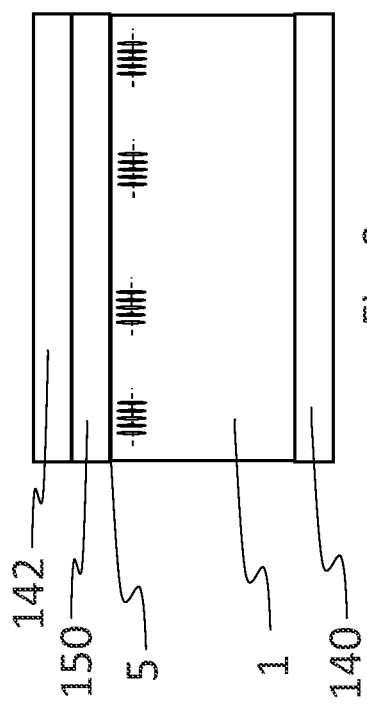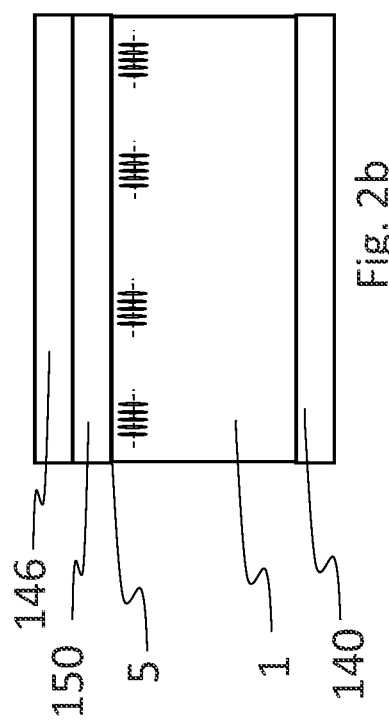

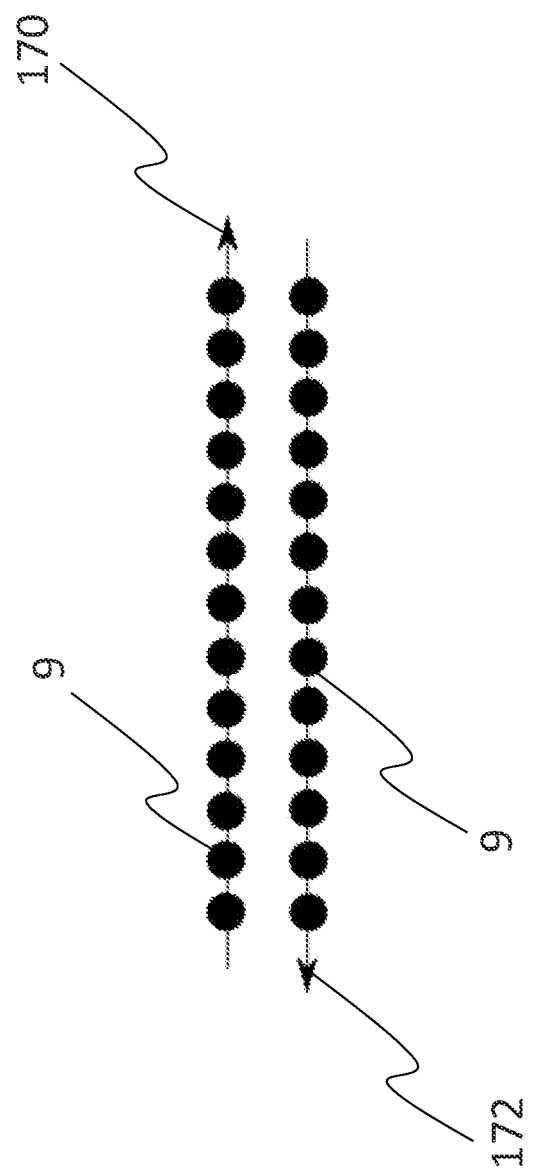

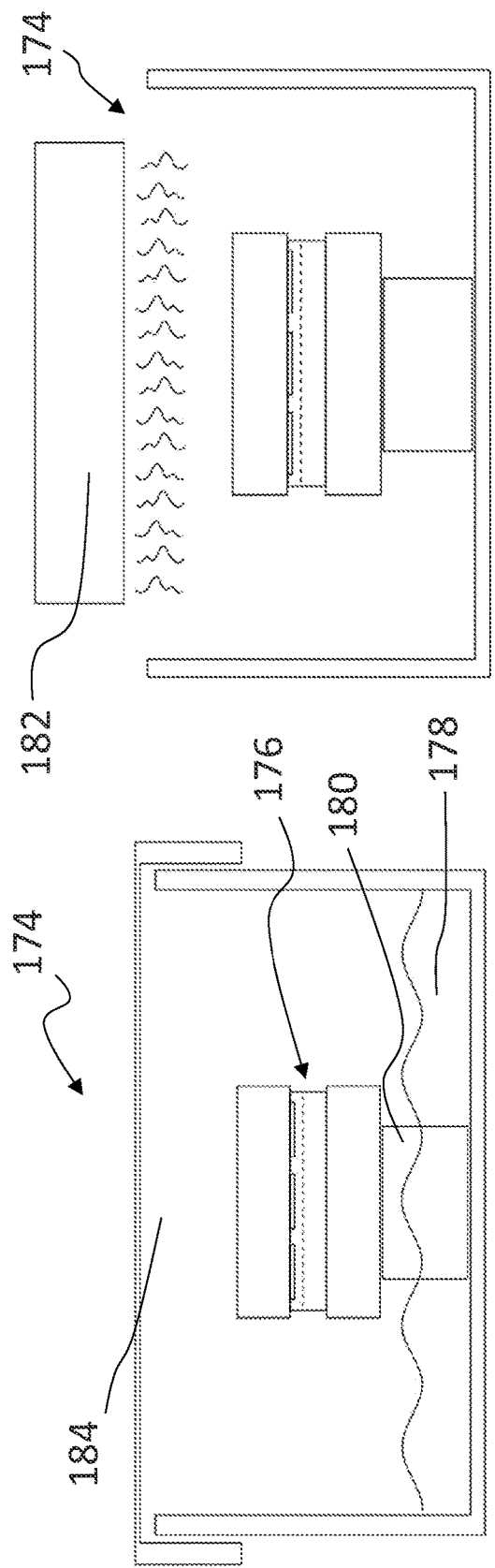
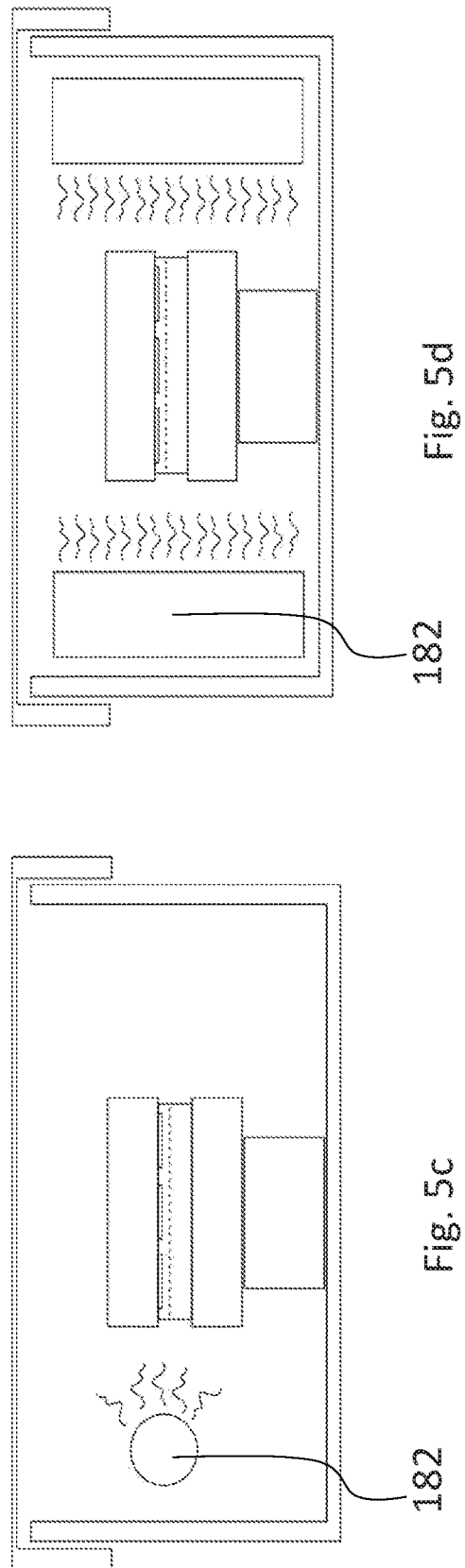

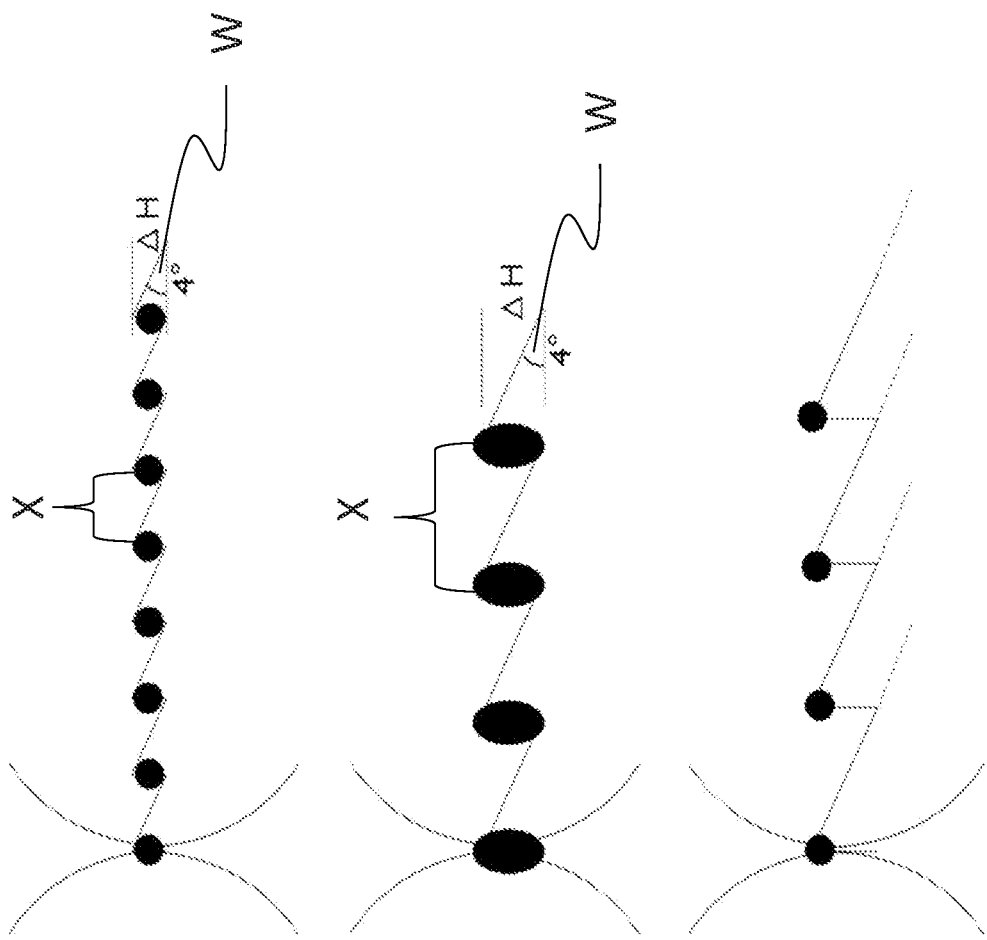

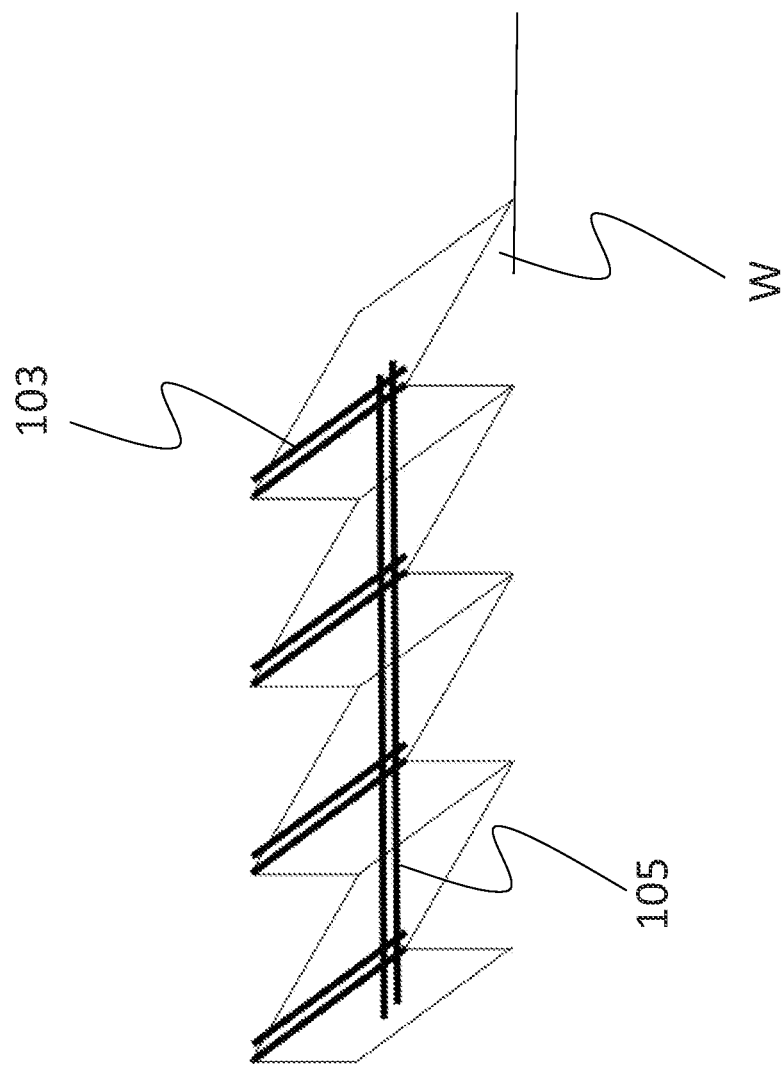

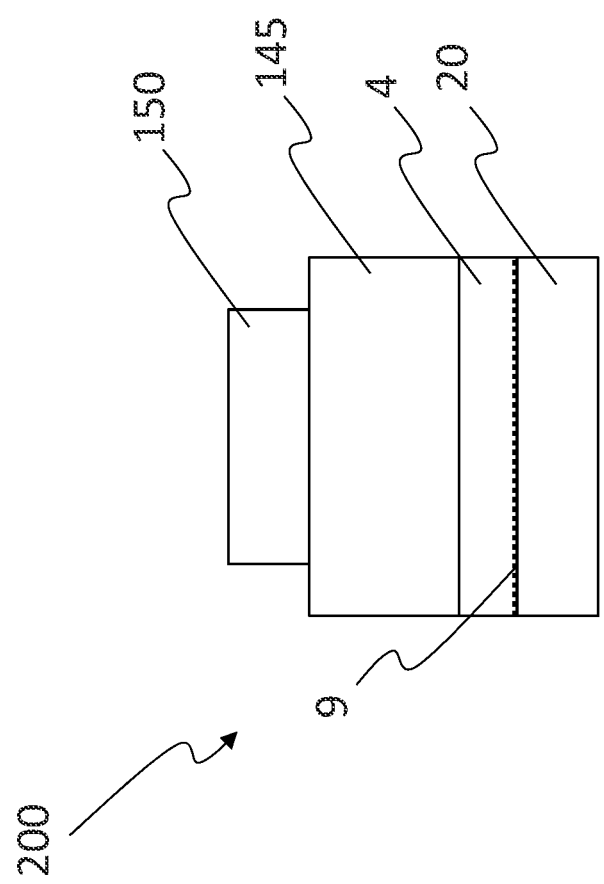

SOLID BODY AND MULTI-COMPONENT ARRANGEMENT

TECHNICAL FIELD

The embodiments described relate to a method for separating at least one solid-body layer from at least one solid body, and to a solid body, in particular, a semiconductor wafer.

BACKGROUND

A series of components in the semiconductor industry are required on thinned solid-body layers and substrates. Since thin substrates are difficult to manage within the scope of usual processes however, and also wafers can only be produced up to a specific thickness using conventional wire sawing processes, the most frequent form of production for such components on thin substrates entails grinding off or thinning the backside of the substrate after processing is finished.

Thereby, a conventional wafer is processed at the end before the finally desired substrate thickness is produced by removing the excess material at a grinding and polishing step at the end. This circumstance is unfavorable for two reasons: on the one hand, valuable material is lost to some extent during the grinding step, and on the other hand, the grinding/polishing step has the potential for a total loss of the already processed components due to substrate damage, which already contain a large part of the wafer's added value.

Another method for thinning solid bodies is revealed by the publication WO2014/177721A1. In accordance with this method, a polymer layer is attached to a solid body. By tempering the polymer layer, tensions within the solid body are then generated, by means of which a solid-body layer is separated from the remaining solid body.

In the publication DE 10 2012 001 620 A1, the use of an additional sacrificial layer between the solid body and the polymer film is described, which is used for the improved removal of the polymer film after the splitting step by chemically decomposing or detaching the sacrificial layer, for example, by means of adding suitable reactants. However, the long duration, which can last for up to several hours that pass until the polymer layer is completely removed, is unfavorable with regard to this method. This severely limits industrial use. In order to accelerate the process of removing the polymer, there is the possibility of introducing additional driving forces by means of a corresponding pretreatment in the form of suitable tensions that also act at room temperature. These lead to an increase in the contact surface for the reactants or the solvent and promote the decomposition or the detachment and removal.

Furthermore, from WO 2010/072675 A2, it is known to provide fillers within the polymer in order to be able to influence the thermal expansion coefficients or the elasticity modulus on a local level. However, it has been shown that such fillers often impair the adhesion of the polymer to the surface of the solid body to be separated so that sufficient force transmission is no longer possible.

SUMMARY

The embodiments described herein improve the thinning of semiconductor substrates, in particular, by preserving material and reducing the wafer losses (so-called yield loss).

The previously mentioned task is achieved by means of a method for separating at least one solid-body layer from at least one solid body. This method preferably comprises at least the steps:

creating a plurality of modifications by means of laser beams within the interior space of the solid body to form a detachment plane, producing a composite structure by arranging or producing layers and/or components on or above an initially exposed surface of the solid body, wherein the exposed surface is an integral part of the solid-body layer to be separated, introducing an external force into the solid body for generating tensions within the solid body, wherein the external force is so strong that the tensions initialize a crack propagation along the detachment plane.

Being particularly preferred, the modifications for forming the detachment plane are created before producing the composite structure.

Thereby, according to the embodiments described herein, before processing the components, the creation of a laser modification layer takes place within the solid body or substrate, which defines the later thinned plane or the detachment plane. Afterwards, the other processes for building up and producing layers and/or for producing components takes place (lithography, etc.).

The layers and/or components, which together with the solid-body layer form the composite structure, are preferably brought about by means of lithography, in particular, by means of coating with metal compounds, painting, optical exposure (e.g. scanning by means of a photomask), developing the photoresist (in particular, at low temperatures, such as temperatures under 70° C., in particular under 50° C. or under 30° C. or under ambient temperature or under 20° C. or under 5° C. or under 0° C.), or etching structures for example. In order to create a circuit, in particular a finished circuit, individual or a plurality or all of these processes, in particular, lithography processes, can be repeated several times, in particular, more than 10 times or up to 10 times or more than 20 times or up to 20 times or more than 40 times or up to 40 times or more than 80 times or up to 80 times.

The solid body remaining after separating the solid-body layer preferably has a thickness, which is greater, in particular, many times greater, than the thickness of the separated solid-body layer. The solid-body material is preferably a semiconductor material or comprises a semiconductor material.

Thereby, it is to be understood that "on or above" a surface of the solid-body layer to be separated can also be understood in such a way that, in the case of a high-temperature step, upstream to the laser treatment for creating the modifications, a coating of the surface produced by the high-temperature method can take place, on which the other layer or other layers and/or components for producing the composite structure are arranged or produced. By definition, the composite structure is only produced after laser treatment, a possible multilayer arrangement, which is prior to the laser treatment, is not referred to as a composite structure within the scope of this patent application, but as a multilayer arrangement.

Thereby, thinning means reducing the thickness of the solid body, which is preferably a wafer, by the material portion that would be abrasively removed in the case of common methods of producing solid bodies provided with components, in particular, wafers, meaning milling it away, grinding it away or polishing it away for example.

According to the embodiments described herein, it is additionally possible that a metal layer on the surface exposed due to the separation of the solid-body layer from the solid body is produced for the at least partial and preferably predominate and, being particularly preferred, full compensation of a deformation of the solid-body layer caused by the pressure tensions of the remaining modification components or for the at least partial and preferably predominate or full compensation of the pressure tensions and/or the metal layer is preferably produced by means of sputtering or electrochemical deposition.

Further preferred embodiments are the object of the subclaims and the following description parts.

In addition, or as an alternative, the previously mentioned task is achieved by means of a method for providing at least one solid-body layer, wherein the solid-body layer is separated from a solid body. Thereby, the method according to the embodiments described herein preferably comprises at least the steps: creating a plurality of modifications by means of laser beams within the interior space of the solid body to form a detachment plane, wherein, pressure tensions within the solid body are generated by means of the modifications, separation of the solid-body layer by means of separating the remaining solid body and the solid-body layer along the detachment plane formed by the modifications, wherein at least components of the modifications generating the pressure tensions remain on the solid-body layer, wherein so many modifications are created that the solid-body layer separates from the solid body due to the modifications or wherein an external force is introduced into the solid body for generating other tensions within the solid body, wherein the external force is so strong that the tensions initialize a crack propagation along the detachment plane formed by the modifications, production of a material layer, in particular, a metal layer, on the surface exposed due to the separation of the solid-body layer from the solid body for the at least partial and preferably predominate and, being particularly preferred, full compensation of a deformation of the solid-body layer caused by the pressure tensions of the remaining modification components or for the at least partial and preferably predominate or full compensation of the pressure tensions.

This solution is favorable since very level solid-body layers can be provided without a machining of the solid-body layer having to take place. In particular, this is useful in the case of the solid-body material SiC, since its production is very expensive and, therefore, material losses must be avoided to the furthest extent possible. Furthermore, SiC is very hard, whereby very expensive grinding tools must be used that wear very quickly due to the very high hardness level of SiC. This solution is furthermore useful since the provided solid-body layers are already equipped with a material layer, in particular, a metal layer, for forming an electrical contact and/or for forming an interface for heat dissipation. Preferably, the production of a composite structure likewise takes place by arranging or producing layers and/or components on or above an initially exposed surface of the solid body, wherein the exposed surface is an integral part of the solid-body layer to be separated. Preferably, the modifications to form the detachment plane are created before creating the composite structure. Furthermore, an external force can be introduced into the solid body for generating tensions within the solid body, wherein the external force is so strong that the tensions cause a crack propagation along the detachment plane.

In addition, or as an alternative, the abovementioned task is additionally achieved by means of a method for producing electrical components. Thereby, the method according to the embodiments described herein preferably comprises at least the steps: creating a plurality of modifications by means of laser beams within the interior space of a solid body to form a detachment plane, wherein pressure tensions within the solid body are generated by the modifications, producing a composite structure by arranging or producing layers and/or components on or above an initially exposed surface of the solid body, wherein the exposed surface is an integral part of the solid-body layer to be separated, separating the solid-body layer by means of separating the remaining solid body and the solid-body layer along the detachment plane formed by the modifications, wherein at least components of the modifications generating the pressure tensions remain on the solid-body layer, wherein so many modifications are created that the solid-body layer separates from the solid body due to the modifications or wherein an external force is introduced into the solid body for generating other tensions within the solid body, wherein the external force is so strong that the tensions cause a crack propagation along the detachment plane formed by the modifications; in the separated solid-body layer, there are preferably pressure tensions to deform the solid-body layer, wherein the pressure tensions are created by means of the components of the modifications remaining in the solid-body layer and the step of producing a material layer, in particular, a metal layer, on the surface exposed by the separation of the solid-body layer from the solid body for the at least partial compensation of a deformation of the solid-body layer due to the pressure tensions of the remaining modification components or for the compensation of the pressure tensions caused by the modification components. Preferably, the production of a composite structure likewise takes place by arranging or producing layers and/or components on or above an initially exposed surface of the solid body, wherein the exposed surface is an integral part of the solid-body layer to be separated. Preferably, the modifications to form the detachment plane are created before creating the composite structure. Furthermore, an external force can be introduced into the solid body for generating tensions within the solid body, wherein the external force is so strong that the tensions initialize a crack propagation along the detachment plane.

In accordance with a preferred embodiment, the surface of the solid-body layer that is exposed due to the separation comprises first surface portions, which have an Ra value (average roughness) of less than 1, in particular, of less than 0.9 or of less than 0.7 or of less than 0.5, in particular, between 0.01 and 0.4. Furthermore, the exposed surface of the solid-body layer preferably comprises second surface portions, which have an Ra value (medium roughness) of more than 1, in particular between 1 and 5. The proportion of the first surface portions is preferably greater than the proportion of the second surface portions, wherein the second surface portions form at least 1% or at least 2% or at least 5% or at least 10% or between 1% and 49% or between 1% and 40%, or between 1% and 30% or between 1% and 20% of the total area formed from the first surface portions and the second surface portions. This solution is favorable since the solid-body layer comprises, even in proportions, Ra values between 1 and 5, in particular, being capable of being processed without other surface conditioning, such as grinding or lapping.

In accordance with another preferred embodiment, the material layer, in particular, a metal layer, is produced on the solid-body layer at a temperature above room temperature in first physical state and in a second physical state at room temperature, wherein, due to the transition from the first physical state into the second physical state, the metal layer impinges the solid-body layer for the at least partial compensation and preferably full compensation of the deformation and pressure tensions caused by the pressure tensions of the remaining modification components. As an alternative, the metal layer can be produced on the solid-body layer at a temperature range over room temperature, wherein the temperature range is at least 100° C. or 150° C. or 200° C. or 250° C. or 300° C. or 350° C. or 400° C. over room temperature and, being particularly preferred, is a maximum of up to 2,000° C. or lower than the melting or evaporation temperature of the solid-body material, wherein, due to the cooling of the metal layer to room temperature, the solid-body layer impinges for the at least partial compensation and preferably full compensation of the deformation caused by the pressure tensions of the remaining modification components or for compensating the pressure tensions. Thereby, due to the cooling and/or solidification of the metal layer, forces, in particular, tensile forces, by means of which the solid-body layer is preferably deformed negatively to the deformation caused by the pressure tensions or by means of which the pressure tensions are compensated. The pressure tensions preferably cause a deformation, which is referred to as bowing. Here, 20° C. is preferably defined as room temperature, wherein room temperature can also describe the temperature in a process area, which can preferably be between 0° C. and 100° C. or between 20° C. and 200° C.

In accordance with another preferred embodiment, the metal layer is produced by means of sputtering or electrochemical deposition. Preferably, in the case of a SiC solid-body layer comprising modification components for example, known sputtered materials or materials that can be used for the electrochemical deposition, such as titanium, titanium tungsten, nickel, platinum $TaSi_2$ and/or gold are used. The thickness of the metal layer is preferably determined by the parameter thickness of the solid-body layer, material of the solid-body layer, area of the solid-body layer, number and type of the modifications.

In accordance with another preferred embodiment, the solid body is made of silicon carbide (SiC) or comprises silicon carbide (SiC), wherein the solid-body layer preferably with a thickness of less than 200 μm, in particular, with a thickness of less than 150 μm or less than 125 μm or less than 110 μm or less than 100 μm or less than 90 μm or less than 75 μm is separated from the solid body. This solution is favorable since SiC is very manageable by means of the methods proposed here and therefore, electrical components can be produced with considerably less material loss and with considerably less wear to the treatment devices.

In accordance with another preferred embodiment, the electrical components are vertical components, in particular, Schottky diodes and/or metal-oxide-semiconductor field-effect transistors (MOSFETs), wherein the metal layer forms an electrical contact, in particular, an ohmic contact, and/or forms an interface for heat dissipation. This embodiment is favorable since vertical components can be produced to be very flat (e.g. by using SiC) and thus also lighter with comparably less material and wear losses. This creates the possibility that significantly more energy-efficient and inexpensive electrical components are produced.

In accordance with another preferred embodiment, the electrical components are horizontal components, in particular, high-electron-mobility transistors (HEMT), wherein the metal layer preferably forms an interface for heat dissipation. This embodiment is favorable since these components can be manufactured to be smaller, lighter and less expensive.

In accordance with another preferred embodiment, on average, per $cm^2$ of a level surface side of the solid-body layer, a multitude, in particular at least 4 or at least 9 or at least 36 or at least 100 electrical components are produced, wherein the electrical components are separated from one another after their production by means of dicing. This embodiment is favorable since the individual electrical components can be separated from one another very quickly and in a very gentle manner Preferably, the individual electrical components have rectangular, in particular, square surfaces. The electrical components preferably comprise external edges between 0.1 mm and 5 mm.

In accordance with a preferred embodiment, for introducing the external force, a receiving layer is arranged on an exposed surface of the composite structure, wherein the receiving layer comprises a polymer material and the receiving layer is thermally applied, in particular, for the mechanical generation of tensions in the solid body, wherein the thermal application represents a cooling of the receiving layer to the temperature under ambient temperature, wherein the cooling takes place in such a way that the polymer material of the receiving layer completes a partial or complete crystallization and/or a glass transition and wherein a crack in the solid body spreads along the detachment plane due to the tensions, which separates the first solid-body layer from the solid body or the external force is introduced into the solid body by applying ultrasound to the solid body, wherein the solid body is preferably thereby arranged in a reservoir filled with a liquid. Ultrasound can be used at a frequency ranging from 20 kHz to 100 kHz, but also within a high-frequency sound range at a frequency ranging from 100 kHz to 1 MHz. Due to these frequencies, preferably, cavitation processes on the solid bodies result in the liquid media with aftereffects, such as collapsing cavitation bubbles. In liquid media, particularly in the region of the phase boundaries, an implosion and deformation of dynamically forming cavitation bubbles and the formation of a microjet result within the nanosecond range. The locally resolved energy release takes place in the form of an adiabatic heating within a very confined space by means of very rapid compression of the gas. Here, extreme temperatures of up to 5,000 kelvin and pressures up to 500 bar occur, which allow for new physical reactions in the region of the boundary layer, which otherwise do not occur. These enormous pressure differences result from the recoil of the bubble front towards the outside (imploding shock wave). Thereby, strongly elevated reaction speeds in this range result. According to the embodiments described herein, being particularly preferred, a locally resolved CNC-controlled application with the aid of an ultrasonic tip (sonotrode), which can specifically cause an influence of the crack initialization and/or crack formation. The locally resolved pressure application can specifically be used for crack initialization and/or crack formation.

The homogeneous and/or locally resolved embodiment is favorable since, in particular, for the use of the receiving layer, a very precise force application and thus crack initialization and/or crack formation can be initialized.

In accordance with another preferred embodiment, the solid body is treated using at least one high-temperature method before creating the detachment plane, wherein the high-temperature method is executed at a temperature between 70° C. and the melting temperature or evaporation temperature of the material of the solid body.

Thereby, according to the embodiments described herein, the execution of the laser step on a partially processed wafer represents another possibility; being particularly preferred, this is carried out after the high-temperature steps, but before the remaining processes. This solution is favorable since not all structures are formed, that can be damaged due to the laser method.

Thereby, parameters of the laser method can be optimized in such a way that the stress in the solid body is minimized to the furthest extent possible, for example, by means of a preserving multiple impingement of the solid body by means of greater line spacing and shrinking energies at each crossing.

The laser process is preferably carried out depending on the crystallographic orientation of the substrate, meaning, being particularly preferred, the laser modification carried out to the furthest extent in such a way that micro-cracks formed during the course of treatment, do not hinder the lithography nor run out of the modification plane in an overcritical manner and can result in substrate loss after initializing the separation crack. In SiC, for example, first lines can be guided in parallel to the preferred crack direction in order to define a crack plane, before, at a second step, lines in a 90° direction to this finally initialize the cracks and define the separation plane.

Carrying out of the high-temperature steps before the creation of the detachment plane is highly favorable since a significant increase in temperature above 70° C. is associated with an increased mobility of doping atoms, atoms of metallic contaminations and displacements or other crystal building errors. If the detachment plane had now been created or been partially created before the high-temperature step, then micro-cracks resulting from it could, for example, extend or grow further into the solid body or into the solid-body layer to be separated, whereby more material would have to be removed and thus greater losses would occur.

In accordance with another preferred embodiment, the at least one high-temperature method is an epitaxy method, a doping method or a method under the use of plasma. All methods, in particular, material deposition methods are understood as high-temperature methods, which are executed at a temperature above 70° C. The occurring temperature is preferably less than 2,000° C. or less than the melting or evaporation temperature of the solid-body material. Due to the high-temperature method, preferably a multilayer arrangement is produced that is made of solid-body material and of the one or at least one created or arranged layer.

In accordance with another preferred embodiment, by means of the high-temperature method, at least one layer is produced on the solid body, wherein the at least one produced layer has predefined parameters, wherein at least one predefined parameter specifies a maximum degree of breakage and/or absorption and/or reflection and/or charge carrier generation by means of photoelectric effect of laser-light waves, wherein the degree of breakage and/or absorption and/or reflection and/or charge carrier generation by means of photoelectric effect is under 5% and preferably, under 1% and, being particularly preferred, under 0.1%. This embodiment is favorable since the interactions of all metal elements of the circuit are inhibited using laser light. As a result of interactions between a metal layer or metallic components and laser light or laser radiation, the metal layer and/or the components, in particular, electrical line connections, can be damaged.

Furthermore, this embodiment solves the further problem if, when introducing the laser plane, metallic structures or components (e.g. larger 20 nm longitudinal extension or extension in the laser penetration direction) are already arranged or produced on the substrate, wherein the laser process is disturbed either by back reflection on the structures or by the structures themselves, since, for example, the transmission is not ideal. Since a multiphoton process is preferably used to create the material modifications, the focus in the material must preferably be very precise, in particular, ideal, in order to make the required high intensities possible while simultaneously having wave fronts that are uninterrupted to the furthest extent possible. Thereby, this advantage also favorably speaks for a laser treatment before processing and creating the final structures, in particular, layers and/or components.

In accordance with another preferred embodiment, the modifications are preferably created by means of a multiphoton excitation, in particular a two-photon excitation.

Preferably, a multitude of basic modifications are initially created on an at least portionally homogeneously extending, in particular curved, line, in particular in the homogeneously extending section. These basic modifications are preferably created using or depending on predefined process parameters. The predefined process parameters preferably comprise at least the pulse duration, pulse energy, pulse interval within a line, line spacing to one another, depth and/or numerical aperture. Preferably, at least one value of these process parameters and preferably, a plurality of values or all values of these process parameters or more than two values of these process parameters are defined depending on the crystal lattice stability of the solid body. Thereby, the value is preferably selected in such a way that the crystal lattice remains intact around the respective basic modifications, meaning it preferably cracks less than 20 μm or less than 10 μm or less than 5 μm or less than 1 μm.

In accordance with another preferred embodiment, initialization modifications are created to initialize subcritical cracks, wherein at least one process parameter for creating the initialization modifications is different from at least one process parameter for creating the basic modifications; preferably, a plurality of process parameters are different from one another. In addition or as an alternative, the initialization modifications can be created in one direction, which is inclined towards or spaced away from the progression of the line, along which the basic modifications are created, wherein the subcritical cracks preferably spread less than 5 mm, in particular, less than 4 mm or less than 3 mm or less than 2 mm or less than 1 mm or less than 0.5 mm Here, an inclined orientation can, for example, correspond to an angle between 0° and 90°, preferably to an angle between 85° and 90°, and, being particularly preferred, to an angle of 90°.

It has to do with a threshold process that is initialized when a critical intensity (i.e. power/surface) is exceeded. That means short pulses need less energy/pulse, higher numerical aperture concentrates the energy on a small point, and also requires less energy in order to reach the threshold intensity.

A greater depth predominately signifies absorption loss, due to which the energy has to be adjusted again, for example, SiC: NA=0.4, 180 μm depth, 3 ns pulse length, pulse energy about 7 μJ, at 350 μm depth rather 9 μJ.

Generally, harder materials (sapphire, aluminum oxide ceramics, SiC, GaN) in the lines of larger pulse overlap, i.e. smaller pulse intervals (<=1 μm), require that for this, the line spacings tend to be selected to be larger (e.g. >5 μm), while softer materials such as GaAs and Si tend to require greater pulse intervals (>1 μm) and require smaller line spacings (<S μm).

Sample pattern SiC—with fs pulses: Pulse energy about 800 nJ, pulse interval 50 nm and greater, up to 200 nm, line pattern as follows: 30 lines with 1 μm spacing, then 20 μm gap, then again 30 lines, then 96 µm gap and then from the front, crossed with 30 lines, 20 µm gap and 30 lines (always with 1 µm distance between the lines), then, 300 µm gap and then again, 30/20/30-series line block. Depth 180 µm, doping degree of SiC (characterized by the surface resistance >21 mOhm cm), pulse length 400 fs, numerical aperture 0.65.

In accordance with a preferred embodiment, the solid-body material is silicon, wherein the numerical aperture is between 0.5 and 0.8, in particular at 0.65, the radiation depth is between 150 µm and 1,500 µm, in particular, at 300 µm, the pulse interval is between 1 µm and 5 µm, in particular at 2 µm, the line spacing is between 1 µm and 5 µm, in particular at 2 µm, the pulse duration is between 50 ns and 400 ns, in particular, at 300 ns and the pulse energy is between 3 µJ and 30 µJ, in particular at 10 µJ.

In accordance with a preferred embodiment, the solid-body material is SiC, wherein the numerical aperture is between 0.4 and 0.8, in particular at 0.4, the radiation depth is between 50 µm and 500 µm, in particular, at 180 µm, the pulse interval is between 0.1 µm and 3 µm, in particular, at 1 µm, the line spacing is between 10 µm and 100 µm, in particular at 75 µm, the pulse duration is between 100 s and 10 ns, in particular, at 3 ns and the pulse energy is between 0.5 µJ and 30 µJ, in particular at 7 µJ.

Aluminum oxide ceramic sample pattern: Pulse interval 500 nm, line interval 10 µm, pulse duration 3 ns, pulse energy 22 pJ, NA=0.4

Sapphire sample pattern: 3-way written lines at 0°, 45°, 90°, each with a line distance of 1.5 µm, pulse interval 300 nm, pulse energy at the first pass 350 nJ, at the second pass 300 nJ and at the third pass 250 nJ, at an NA of 0.65 and a pulse duration of 250 fs.

In general, the surface roughness decreases with shorter pulses; with femtosecond pulses, better surfaces can be created (roughness under 3 µm) than is the case with nanosecond pulses (rather above 3 µm), but due to that, the process is more expensive and takes longer. Picosecond pulses represent a middle ground. The advantage of shorter pulses is that the phase transformation takes place athermically, i.e. coupling occurs between laser pulses and crystal lattice, so that fewer vibrations (phonons) are excited—the process takes place in a colder manner overall. For this, greater areas must be amorphized (phase transformation) so that critical tension is built up, which initializes the cracks.

In accordance with another preferred embodiment, the subcritical cracks spread in the solid body between 5 µm and 200 µm, in particular, between 10 µm and 100 µm or between 10 µm and 50 µm or between 10 µm and 30 µm or between 20 µm and 100 µm or between 20 µm and 50 µm or between 20 µm or 30 µm. This embodiment is favorable since a smaller crack propagation requires a less post-processing effort. The subcritical cracks spread along the crystal lattice boundaries, however, since the crystal lattice of the solid body is preferably inclined with respect to the detachment plane, in particular, at an angle between 0° and 6°, a saw-tooth-shaped surface profile results. The further the cracks run, the greater the spacing between the troughs and tips of this saw-toothed surface is, whereby even more material also has to be removed if a surface roughness of less than 80 nm or less than 50 nm or between 20 nm and 50 nm should be produced.

The crack propagation of the subcritical cracks thereby extends in accordance with a further embodiment in relation to the radiation direction of the laser beams in a deviating direction inclined at an angle of 90°, in particular, the crack propagation direction is preferably between 93° and 95°, in particular, exactly 94° in relation to the radiation direction.

In accordance with another preferred embodiment, the sections crack between the regions having a plurality of lines, in which the subcritical cracks have propagated, due to the tensions or the introduction of the external force, which are, for example, generated by means of glass transition or ultrasound treatment. This embodiment is favorable since the required tensions can be considerably lower due to the previously caused damage to the interior space of the solid body, in particular, due to the subcritical cracks. Furthermore, the crack is formed in a very precise manner.

In accordance with another preferred embodiment, the receiving layer is arranged or produced on a surface of the solid body, which is opposite the surface of the solid body, at which the layers and/or components for forming the composite structure are arranged.

Before initializing the crack, the receiving layer according to the method, in particular in the form of a polymer film, is applied to the side of the solid body, on which, preferably, no other layer and/or components are arranged.

The receiving layer in accordance with another preferred embodiment, in terms of mass, is at least predominately and preferably completely made of the polymer material, wherein the glass transition of the polymer material is between −130° C. and 0° C., in particular, between −85° C. and −10° C. or between −80° C. and −20° C. or between −65° C. and −40° C. or between −60° C. and −50° C.

In accordance with another preferred embodiment, the polymer material of the receiving layer consists of a polymer-hybrid material or has one that forms a polymer matrix, wherein a filler is formed in the polymer matrix, wherein the polymer matrix is preferably a polydimethyl-siloxane matrix and the mass proportion of the polymer matrix of the polymer-hybrid material is preferably 80% to 99% and, being particularly preferred, 90% to 99%.

According to the embodiments described herein, a polymer-hybrid material is therefore indicated for use in a splitting method, in which at least two partial solid-body pieces are produced from a solid-body source material. The polymer-hybrid material comprises a polymer matrix and at least one first filler embedded within it. To the extent a or the filler is spoken of, the possibility of a plurality of fillers must be equally taken into consideration. For example, the filler can comprise a mixture of different materials, for example, metal oxide, metal particles and inorganic fibers.

As a polymer matrix, any polymer or mixture of different polymers can be used to generate the tensions necessary for a division of the solid-body source material. For example, the polymer matrix can be designed as an elastomer matrix, preferably as a polydiorganolsiloxane matrix, being particularly preferred, as polydimethilsiloxane matrix. Such polymer materials can be used particularly easily as a matrix material in combination with fillers since the properties can be flexibly adjusted due to the variable level of connectivity and can be adapted to the respective filler as well as the solid-body source material to be divided. In accordance with a design variant, the mass proportion of the polymer matrix in the polymer-hybrid material is 80% to 99%, 10 preferably 90% to 99%.

The first filler can be of an organic or inorganic nature and be made of both a chemical element as well as a chemical compound or a material mixture, for example, an alloy.

The first filler is structured in such a way that it acts as a reactant, initiator, catalyst or promoter during the removal of the polymer-hybrid material from the partial solid-body piece after division and thus results in a quicker detachment of the polymer-hybrid material from the partial solid-body piece after division in comparison to a polymer material without a first filler.

The specific chemical composition and design of the first filler as well as its mass proportion depends, in particular, on the specific material of the polymer matrix, which is to be removed, the solvent used for this purpose and the reactants used for it. Furthermore, also the material of the solid-body source material and the dimensions of the solid-body source material to be separated play a role.

The specific proportion of the first filler in the polymer matrix strongly depends on the material of the filler and its mode of action. On the one hand, the polymer matrix cannot fulfill its task of generating tensions despite a filler. On the other hand, the proportion of the first filler must be high enough in order to achieve a pursued influence of the polymer removal. The person skilled in the art can determine the respective optimal mass proportion of the first filler within the scope of simple tests carried out in a concentration-dependent manner.

Additionally, another filler, such as pyrogenic silica in the form of an inorganic network in the polymer can contribute to improving the mechanical properties. In addition to these strong interactions in the form of the network less strong interactions can contribute to improvement by means of purely hydrodynamic reinforcements. An example of this is a targeted increase in viscosity, which enables improved processing in the splitting process and can therefore contribute to improved production tolerances. Furthermore, due to this interaction, a reduction in the internal degrees of freedom in terms of a structural reorientation is made more difficult with increasing reinforcement.

This leads to a desired reduction in the glass transition temperature of the used polymer in the polymer-hybrid material, which makes the advantage of a lower temperature in the splitting process possible. According to the embodiments described herein, the first filler in a polymer-hybrid material is used to accelerate the removal of the polymer-hybrid material from a partial solid-body piece, which is obtained by division by means of a splitting method where a solid-body source material is divided into at least two partial solid-body pieces.

The first filler can be distributed in the polymer matrix in such a way that the mass proportion of the first filler, starting from the external, meaning the lower boundary of the polymer-hybrid material, which is connected during the splitting process to the solid-body source material, decreases in the direction of a further boundary of the polymer-hybrid material arranged in parallel to the lower boundary. This means that the mass proportion of the filler near the solid-body source material or partial piece is larger than the remaining regions of the polymer-hybrid material. This distribution of the first filler allows for a particularly effective removal of the polymer-hybrid material after separation since the first filler is located close to the boundary to the partial solid-body piece and its effect can unfold there. At the same time, the remaining regions of the polymer-hybrid material have less or no proportions of the first filler, so that the function of the polymer is influenced as little as possible.

In an embodiment, the polymer-hybrid material is structured in layers, wherein only one layer facing the solid-body source material comprises the first filler, while the remaining polymer-hybrid material is free of the first filler.

Furthermore, a lower region of the polymer-hybrid material, which directly abuts its lower boundary, can be free of the first filler. Thereby, a region sequence can result as follows: adjacent to the solid-body source material, there is initially a region without a first filler, then a region with a high level of first filler and then there is a region with a low level of first filler or without a first filler.

These and all of the regions described below can be designed in the form of layers, meaning the region extends predominantly parallel to the boundary of the solid-body source material, onto which the polymer-hybrid material is applied and comprises a longitudinal and a transverse-expansion, at least in the region of this boundary.

A lower region without a first filler can be provided, in particular, in the event that the first filler worsens the adhesion of the polymer-hybrid material on the solid-body source material. To avoid this, a region without a first filler is initially arranged, followed by a region with a high level of first filler so that the first filler can perform its function. The lower layer without a first filler, can, for example, have a thickness between 10 μm and 500 μm, for example, 100 μm.

Furthermore, an upper region of the polymer-hybrid material, which directly abuts its upper boundary, can be free of the first filler. Under the upper boundary, the boundary is understood that limits the polymer-hybrid material opposite to the lower boundary and to the solid-body source material towards the environment. The upper and lower boundary can be arranged in parallel to one another.

Such an upper region without a first filler can, in particular, be provided if the first filler adversely affects the heat transfer between the environment and polymer-hybrid material, for example, when the cooling of the polymer-hybrid material would be delayed.

The first filler can comprise a material or be made of a material that can react with a reactant, preferably an oxidant, releasing a gaseous product.

As a result, in the polymer matrix, cavities can be created, which allow faster access of the reactants and solvents to the polymer matrix and a possible existing sacrificial layer, as well as faster removal of the educts and detached components.

By generating gaseous reaction products, additional driving forces can be introduced to further support the removal of the polymer-hybrid material.

The formation of additional cavities and the emergence of gaseous reaction products accelerates polymer removal and therefore contributes to an increase in the overall yield of the splitting process. By varying the proportion of the first filler, the cavity density in the boundary region between the partial solid-body piece and polymer-hybrid material or between the sacrificial layer and the polymer-hybrid material can be specifically influenced.

The first filler can comprise a metal, in particular aluminum, iron, zinc and/or copper or be made from metal, in particular, be made of one of the previously mentioned metals.

"Made of" includes all presently mentioned materials that can contain technology-related impurities or technology-related supplements, which are used, for example, in producing fillers and their distribution or bonding to the polymer matrix.

Metallic fillers can react with oxidants such as hydrochloric acid, nitric acid, citric acid, formic acid or sulfamic acid with the release of a gaseous product and thus be removed from the polymer-hybrid material.

For example, aluminum reacts with a concentrated hydrochloric acid under the formation of solvated metal ions or hydrogen in accordance with the following equation: 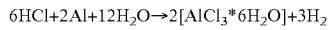

$$6HCl + 2Al + 12H_2O \rightarrow 2[AlCl_3 * 6H_2O] + 3H_2$$

In a similar way, the reaction of zinc as a filler by means of a reaction with concentrated hydrochloric acid results in the formation of additional cavities. $Zn+2\ HCl \rightarrow ZnCl_2+H_2$. In the examples shown, by means of generating hydrogen, additional driving forces are introduced, which further support the removal of the polymer-hybrid material. In addition, the first filler can improve the temperature conductivity within the polymer-hybrid material, for example, by the first filler having a higher temperature conductivity than the polymer of the polymer matrix. This can be the case, for example, if another advantage, in the event that the first filler comprises a metal, lies in the improved temperature conductivity within the polymer-hybrid material. As a result of improved temperature conductivity, the tensions generated for the division of the solid-body source material by means of cooling can be more effective, meaning they can be generated faster and with a lower consumption of coolant. This increases the overall yield of the splitting process.

Furthermore, within the polymer-hybrid material, a second filler is provided, which increases the adhesion of the polymer-hybrid material to the solid-body source material in comparison to a polymer-hybrid material without a second filler. Preferably, the adhesion is increased in comparison to a polymer material without a filler.

For example, the second filler may be a filler that can be activated by plasma. Plasma activation results in new surface species that can be created in such a way that a stronger interaction with the surface of the solid-body source material results and, as a result, the adhesion of the polymer-hybrid material is improved.

Thereby, the surface species achievable by means of plasma treatment primarily depends on the plasma process execution. For example, gases such as nitrogen, oxygen, silane or chlorosilane can be added during plasma treatment, creating, for example, polar groups that can interact more intensely with the surface of the solid-body source material.

The second filler can be distributed in the polymer matrix in such a way that the mass proportion of the second filler increases in the direction of the lower boundary. For example, the polymer-hybrid material can contain the second filler only in a region adjacent to the lower boundary, wherein the area can also be formed as a layer in terms of the abovementioned definition.

This allows the arrangement of the second filler preferably close to the boundary between polymer-hybrid material and solid-body source material, whereby the adhesion is improved and thus a greater force transmission into the solid-body source material to be divided is made possible. For example, the second filler may include core/shell polymer particles.

Particles whose polymer composition differs from the polymer matrix of the polymer-hybrid material are preferred in that the surface, meaning the shell, of the core/shell particles in particular is more activatable, for example, by means of low-temperature plasma.

Examples include core shell particles comprising a polysiloxane core with an acrylic shell or comprising a nanoscale silicate core with an epoxy shell or comprising a rubber particle core with an epoxy shell or comprising one nitrile-rubber-particle core with an epoxy shell. The second filler can be activatable by means of a low-temperature plasma, for example, cold plasma. For example, the plasma can be created by means of dielectric barrier discharge (DBE). Electron densities at a range from 1014 to 1016 m$^{-3}$ can be created. The average temperature of the "cold" non-equilibrium plasma (plasma volume) generated by DBE is about 300±40 K at ambient pressure. The average temperature of the non-thermal plasma produced by DBE is approximately 70° C. at ambient pressure.

During DBE treatment, for example, the surface is applied using uniform or bipolar pulses with pulse durations ranging from a few microseconds to several tens of nanoseconds and amplitudes within the single to double-digit kilovolt range. Here, no metal electrodes and thus no metal contaminations or electrode wear are expected in the discharge space.

Favorably, in addition, there is a high level of efficiency since no charge carrier must exit or enter on the electrodes.

Dielectric surfaces can be modified and chemically activated at low temperatures. The surface modification can, for example, take place by means of an interaction and reaction of the surface species by means of ion bombardment.

Furthermore, process gases such as nitrogen, oxygen, hydrogen, silane or chlorosilane, for example, $Si_xH_yE_z$ with E=F,Cl,Br,I,O,H and x=0 to 10, z=0 to 10, $SiH_4$, $Si(EtO)_4$ or $Me_3SiOSiMe_3$, are added in the case of plasma treatment in order to create certain chemical groups on the surface. The second filler can also be activated by means of corona treatment, flame treatment, fluorination, ozonization or UV treatment or eximer radiation. Such an activation, for example, creates polar groups on the surface of the second filler, which can interact with the surface of the solid-body source material and thus improve adhesion. Furthermore, the polymer-hybrid material can additionally comprise a third filler compared to a polymer-hybrid material with a first or a polymer-hybrid material with a first and a second filler. This third filler comprises a high-temperature conductivity and/or a higher elasticity modulus in comparison to the polymer of the polymer matrix.

For example, the polymer's e-modulus is in the lower single-digit gigapascal range (about 1-3 GPa) at low-temperature conditions, while metallic fillers, for example, have an e-modulus in the double-digit to three-digit gigapascal range. In the case of a correspondingly high filler portion, a percolating filler network is possible, which makes an improved "force coupling" into the solid-body source material possible.

Percolation is significantly influenced by the volume level of the respective fillers (e.g. 0.1 Vol %, 1 to 30 Vol % to 10 Vol % depending on aspect ratio). As the introduction of force increases, the viscoelastic layer structure of the polymer structure can be immersed, and a plurality of percolation paths become effective. Here, improved heat transfers can be made possible since it can result in an improved contact of the filler to the surface of the solid-body source material.

The mechanical stability of the polymer-hybrid material is achieved faster even at low temperatures. In sum, there is a lower standard deviation of the corresponding structure property profiles, such as breaking tension and break elongation of the polymer-hybrid material, and thus an increase in the overall yield of the splitting method. The locally resolved property profile changes (tension peaks in the polymer-hybrid material) and thus in the solid body are smaller, resulting in a higher overall yield of the splitting method and a better quality of the produced partial solid-body pieces.

The third filler can cause an improved heat transfer between the environment and polymer-hybrid material and faster thermal conduction within the polymer-hybrid material so that the polymer-hybrid material can be cooled down faster and overall, the splitting method can be performed faster and thus more effectively.

By increasing the elasticity modulus, higher tensions can be created for the division of the solid-body source material so that solid-body source materials can also be divided, for which a particularly high tension is required.

In addition, the third filler can also be used to influence the thermal expansion coefficients. Thereby, the goal is the greatest difference possible between the heat expansion coefficients of the polymer-hybrid material and of the solid-body source material to be separated in order to be able to create additional tensions required for the division. Preferably, the third filler comprises a high thermal expansion coefficient, meaning an expansion coefficient, which is greater than the one belonging to the polymer matrix. For example, the thermal expansion coefficient of the third filler can be more than 300 ppm/K.

The third filler can be distributed in the polymer matrix in such a way that the mass proportion of the third filler increases towards the upper boundary in order to allow a faster heat transfer, especially at the boundary to the surrounding area.

The third filler can comprise a metal, in particular, aluminum, iron, zinc and/or copper or be made from one of the said metals. Metals are generally characterized by a high thermal conductivity and temperature conductivity.

The fillers described (first, second, third filler) may be present in a particulate form, distributed in the polymer matrix, wherein the particle size can be in the μm and nm range relative to at least one dimension of the particle. In addition to a spherical form, the filler particles can also assume other embodiments, for example, a rod-shaped or disk-shaped form.

The filler particles can comprise all particle size distributions, for example, monomodal or bimodal, narrow, in particular, monodisperse or wide. The fillers can be connected to the polymer matrix both physically, for example, by embedding into the polymer network, as well as chemically. Furthermore, one or a plurality of the described fillers can comprise or be made of inorganic or organic fibers, such as coal, glass, basalt or aramid fibers, provided that the functions described above are compatible with them. As an option, another filler can also be added, which comprises the mentioned fibers or is made of such.

Fibers usually have highly anisotropic properties. By directionally positioning the filler in the polymer-hybrid material, it is possible to have a targeted influence on the tensions necessary for the division of the solid-body source material. This can contribute to the increase of the overall yield of the splitting process. An additional advantage in the case that an organic or inorganic filler is used as a fiber with a highly anisotropic structure is that it improves the mechanical properties within the polymer-hybrid material.

The described fillers can additionally comprise core/shell particles or be made of this. In addition, or alternatively, another filler comprising or made from core/shell particles can be provided within the polymer-hybrid material.

The use of core/shell polymer particles also allows not only for improved activation ability, but also a new design of energy-absorbing mechanisms, which, in sum, lead to an increase in impact resistance and fracture toughness, in particular, an increase in low-temperature impact resistance of the polymer-hybrid material when using during the splitting method and thus also contribute to a higher overall yield of the splitting process. For example, a mechanical destruction of a film made from a polymer-hybrid material may be less likely, thus being capable of favoring the possibility of reusing the film.

For example, by preventing crack propagation due to core/shell polymer particles, the film can be prevented from being destroyed during the splitting process and thus recycling pathways can be opened up.

Hereby, contained elastomer particles can experience plastic deformation and form cavities, whereby other additional energy can be absorbed. Similarly, additional energy absorption can be compensated by the shear flow of the matrix, which improves the mechanical properties overall. Core/shell particles are characterized in that a generally spherical core made of a material is surrounded by a shell made of a second material. The shell can either completely envelop the core or be permeable. In the case of the materials, it can have to do both with inorganic materials, such as metals or with organic materials, such as polymers for example. For example, two different metals can be combined with one another. There is also the possibility to surround a core made of a polymer with a shell made of a metal or a second polymer.

Core/shell particles make the combination of properties of the first and second material possible. For example, via an inexpensive polymer core, the size and density of the filler particles can be determined while the metal shell can react as described above.

Due its often monodisperse particle size distribution, the properties of the core/shell particles can be predicted and adjusted in a precise manner.

In addition, one or a plurality of fillers (first, second and/or third filler) can comprise carbon in the form of carbon black, graphite, chopped carbon fibers, carbon nanofibers, preferably in the form of carbon nanotubes (CNT), such as multi-walled carbon nanotubes (MWCNT) and single-walled carbon nanotubes (SWCNT), or be made of them. In the case of carbon nanotubes, it has to do with cylinder-shaped graphite layers, which are constructed from a various number of cylinders.

If these pipes are only made of one cylinder, they are referred to as single-walled carbon nanotubes (SWCNT). If two or a plurality of cylinders are present, either double-walled (DWCNT) or multi-walled carbon nanotubes (MWCNT) result. These can preferably be nested concentrically into each other.

According to various design variants, the third filler can comprise or consist of MWCNTs, as they have a particularly high thermal conductivity (>3,000 W*(m*K)$^{-1}$) and at the same time have a very high tear resistance in the range of 5-60 GPa. The high level of mechanical stability is shown in high tensile strength values, extreme elasticity and a very good durability of the filler.

The basis for this is the sp2 hybridized strong, σ-C—C-bonds combined with a delocalized p-orbital as a π-bond to three adjacent carbon atoms. Hereby, bending of up to 90° is possible.

With SWCNT, even higher property values are achievable (e-modulus: 410 GPa to 4150 GPa vs. Graphite: 1000 GPa, SWCNT: Thermal conductivity approx. 6,000 W*(m*K)$^{-1}$). However, here, a worse performance/cost ratio is shown in comparison with MWCNT. The cylinder diameters of MWCNT typically range from 1 nm to 100 nm, preferably, from 5 to 50 nm, with a length of 500 nm to 1,000 μm.

In accordance with other design variants, the third filler can comprise MWCNT and, at the same time, the second and/or first filler can comprise carbon black or be made of this since, here, an improvement of the heat conductivity (e.g. up to 200 W*(m*K)$^{-1}$) can also be achieved. Since the use of carbon black, for example, has a considerably lower tensile strength with values of <0.4 Gpa, a combination of both or other fillers is possible and can result in an improvement of the overall splitting yield and in an improvement of the overall costs in the splitting process.

Here, the average diameters of the carbon-black particles range from 5 nm to 500 nm, preferably, from 20 nm to 200 nm, being particularly preferred, from 40 nm to 100 nm.

Furthermore, the fillers can comprise silica, for example, pyrogenic silica or be made of this. In addition, or alternatively, another filler comprising or made from silica can be provided within the polymer-hybrid material.

Pyrogenic silica can form a three-dimensional network and, by means of this, contribute to the improvement of the mechanical stability. Thus, such a filler can serve to specifically set the mechanical properties of the polymer-hybrid material. One or a plurality of the mentioned fillers (first, second, third filler) can be made of the same material provided that this is agreeable with the function ascribed to them. For example, both the first as well as the third filler can comprise aluminum or be made of aluminum. As described above, aluminum can be used for generating cavities and thereby, for accelerating the removal of the polymer-hybrid material from the partial solid-body piece, as well as for increasing temperature conductivity. Such an embodiment simplifies the production process since it can be sufficient to only add one or two fillers in order to fulfill all functions.

The first and second as well as, where applicable, the third filler can also be made of different materials. This allows for an individual and therefore better adaptation of the filler to the desired function.

A film according to the embodiments described herein comprises a polymer-hybrid material, as is described in the above. The film can have a thickness of 0.5 to 5 mm for example.

On at least this surface, a polymer-hybrid material according to the embodiments described herein or a film according to the embodiments described herein is applied so that a corresponding composite structure results. The applied polymer-hybrid material and the applied film are also referred to in the following as a receiving layer. The thickness of such a receiving layer can, for example, be between 0.5 mm and 5 mm, in particular, between 1 mm and 3 mm. As an option, the polymer-hybrid material or the film can also be applied to a plurality of exposed surfaces, in particular, to surfaces arranged in parallel to one another.

The thermal application preferably entails a cooling of the receiving layer under ambient temperature and preferably under 10° C. and, being particularly preferred under 0° C., and being furthermore preferred under −10° C. or under −40° C.

Being the most preferred, the cooling of the receiving layer takes place in such a way that at least one part of the receiving layer completes a glass transition or, however, undergoes a partial or a complete crystallization. The cooling can thereby be a cooling under −130° C., which can be affected by means of a liquid nitrogen for example. This embodiment is favorable since the receiving layer contracts depending on the temperature change and/or experiences a glass transition, and the forces resulting thereby are transmitted to the solid-body source material, whereby mechanical tensions can be created within the solid body, which lead to the initializing of a crack and/or to crack propagation, wherein the crack initially propagates along the first detachment plane for splitting the solid-body layer.

At another step, the polymer-hybrid material or the film is removed from the partial solid-body piece, for example, by means of a chemical reaction, a physical detachment process and/or a mechanical removal.

The detachment of the polymer-hybrid material from the partial solid-body piece can take place at moderate ambient temperature, for example, at a range of 20° C. to 30° C., preferably within the higher temperature range from 30° C. to 95° C., for example, from 50° C. to 90° C., or, for example however, also at a lower temperature range between 1° C. and 19° C.

The elevated temperature range can make a shortening of a chemical removal reaction due to an increase in reaction speed, for example, in the case of using a sacrificial layer between the polymer-hybrid material and the solid body. In the case of using a sacrificial layer, the stripping away can take place in a watery solution, favorably having a pH value ranging from 2-6. In accordance with various design variants, for example, the detachment process can take place in the form of a treatment with a solution made of a suitable apolar solvent, wherein moderate ambient temperatures at a range from 1° C. to 50° C. are preferred and at a range from 20° C. to 40° C. are particularly preferred.

A particular advantage here entails the detachment without a temperature reaction onto the film. Here, aliphatic and aromatic hydrocarbons such as toluene, n-pentane, n-hexane, but also halogenated solvents, such as carbon tetrachloride, can favorably be used. Here, additional forces can be introduced into the polymer-hybrid material to be removed and the boundary to the partial solid-body piece since a very high level of reversible swelling of the polymer-hybrid material can occur due to a solvent treatment, wherein the removal is simplified overall.

In accordance with other design variants, a combination with the above-described removal mechanism of the sacrificial layer and the treatment with a suitable apolar solvent can take place—also without the film being affected by temperature.

A stabilization layer can be arranged or produced on the exposed layer or the exposed components of the created composite structure for limiting deformations of the exposed layer or of the exposed components, wherein the deformations result from the mechanical tensions introduced by means of the receiving layer. The side with components is thereby preferably preserved and protected (e.g. against warping of the substrate or of the solid body and dust-free conditions). This can be done via soluble polymers (organics) or holding layers. This embodiment is favorable because it limits interaction with, for example, small MEMS structures. The surface quality of a wafer equipped with components is normally not regular, which can lead to field elevations and local surface damage in the case of strong or abrupt movements. Thereby, this embodiment presents a solution, which causes a good protection of the solid-body layer and the layers and/or components created and/or arranged on it, in particular against mechanical damage or destruction.

The method can preferably also or alternatively comprise individual or a plurality of steps: Provision of a solid body for separating at least one solid-body layer, wherein the solid body comprises a first level surface portion and a second level surface portion, wherein the first level surface portion is preferably predominately or exactly parallel to the second level surface portion.

Creating defects by means of at least one radiation source, in particular, a laser, in the inner structure of the solid body for specifying a crack initialization point, starting from which the solid-body layer is separated from the solid body.

Creating defects or modifications by means of laser beams in particular, at least one laser, in the inner structure of the solid body for specifying a crack formation, along which the solid-body layer is separated from the solid body, wherein the laser beams penetrate into the solid body via the second level surface portion.

In accordance with another preferred embodiment, the stabilization layer is made from or comprises a preferably water-soluble ceramic, in particular, Fortafix by Detakta, and/or a soluble polymer, in particular poly(ethylene glycol) (PEG), in particular with different and/or adapted chain lengths. In the case of Fortafix, it has to do with a one- or two-component ceramic cement for use as glue, glazing for protecting against corrosion and chemical factors, casting compound for mold making or for insulation, as a dipping mass for attaching hot wires, for the insertion of knife blades, for example, in metal or ceramic handles. The polymer (PEG) is soluble in water and a number of organic solvents. It is insoluble in hexane, diethyl ether and tert-butyl methyl ether—thus other organic solvents. Accordingly, the surface structures/components can be filled with PEG before a protective layer is applied. The stabilization layer is preferably provided in-situ or as a film. In addition, or as an alternative, the stabilization layer is infused or the layer and/or a liquid material is applied onto the exposed components, which becomes the stabilization layer after hardening and solidifying. In addition, or as an alternative, the stabilization layer is removed from the layer or the exposed components by applying a solvent or by dipping into a solvent. The stabilization layer thereby comprises a ceramic material or is made of it and/or it comprises a polymer material or is made of it.

In accordance with another preferred embodiment, the modifications are successively created in at least one line or row, wherein the modifications made in a line or row are preferably created at a spacing X and with a height H so that a crack extending between two consecutive modifications, in particular, a crack extending in the crystal lattice direction, the crack propagation direction of which is aligned at an angle W to the detachment plane, connects both modifications to one another. The angle W is preferably between 0° and 6°, in particular, at 4°. Preferably, the crack extends from a region under the center of a first modification towards a region above the center of a second modification. The essential connection here is that the size of the modification can or must be changed depending on the spacing of the modifications and of the angle W.

In accordance with another preferred embodiment, at a first step, the modifications are created on a line, thereby preferably being at the same spacing to one another. Furthermore, it is conceivable that a plurality of these lines created at the first step are created. Being particularly preferred, these first lines are created to be parallel to the crack propagation direction and, preferably to be straight or circularly arched in shape, in particular on the same plane. After creating these first lines, second lines are preferably created to propagate and/or instigate preferably subcritical cracks. These second lines are also preferably created to be straight. Being particularly preferred, the second lines are inclined in relation to the first lines, in particular, being orthogonally oriented. The second lines preferably extend on the same plane as the first lines or, being particularly preferred, on a plane that is parallel to the plane, in which the first lines extend. Then, third lines are preferably created for connecting subcritical cracks.

In accordance with another preferred embodiment, a cooling device is provided to cool the receiving layer to a temperature between −130° C. and −10° C., in particular to a temperature between −80° C. and −50° C. The cooling device preferably comprises a nebulizing means, in particular at least or exactly one perforated pipeline for nebulizing liquid nitrogen and the cooling effect is preferably created by means of nebulized nitrogen. As an alternative, it is conceivable that the cooling device comprises a nitrogen bath, wherein the receiving layer is positioned at a distance away from the liquid nitrogen held in the nitrogen bath. As an alternative, it is conceivable that the cooling device is provided with a spraying means providing in particular liquid or vapor-like nitrogen preferably in a uniform manner, wherein the spraying means is preferably arranged above and/or on the side of the receiving layer. This embodiment is favorable since the liquid nitrogen is quite suitable for the defined cooling of objects. Furthermore, this embodiment is favorable since a much more energy-efficient process is provided with relation to low-temperature processes of less than −80° C. or less than −90° C.

The cooling device preferably comprises a nitrogen bath and positioning device to adjust the distance of the position of the receiving layer to the liquid nitrogen held in the nitrogen bath, wherein the nitrogen bath and the positioning device are preferably arranged in a space that is at least partially opposite the environment and prefers completely demarcated space.

One or a plurality of temperature measurement device(s) is/are provided in accordance with another preferred embodiment. Preferably, temperature measurement(s) are carried out using the temperature measurement device(s), wherein the recorded temperature values are preferably used to regulation the setting or the flow rate by means of a nitrogen valve for temperature control.

For the homogeneous tempering, in addition, a ventilator can be used inside of the chamber, which creates a forced convection, thereby reducing temperature gradients.

Another possibility (not shown) of cooling is contact cooling using a tempered cooling body, which a coolant flows through within a closed circuit and is put into contact with the solid body for example.

The temperature measurement preferably takes place on the solid body, in particular, on the receiving layer and/or on the underside of the solid body; preferably the solid-body underside is arranged at a spacing from the chamber bottom, wherein a positioning device is provided for positioning the solid body, by means of which, being particularly preferred, the spacing of the solid body to the chamber bottom or the spacing of the receiving layer to the liquid nitrogen can be changed, in particular, depending on temperature.

Furthermore, a chamber is preferably provided for accommodating the nitrogen and positioning equipment, wherein the chamber is preferably sealable and/or thermally isolated from the environment.

In accordance with the present description, under a solid-body source material, preferably, a monocrystalline, polycrystalline or amorphous material is understood. Preferably, monocrystallines with a highly anisotropic structure are suitable due to the highly anisotropic atomic bonding forces. The solid-body source material preferably comprises a material or immaterial combination made of one of the main groups 3, 4, 5 and/or the auxiliary group 12 of the periodic table of elements, in particular, a combination of elements of the third, fourth, fifth main group and the subgroup 12, such as zinc oxide or cadmium telluride.

In addition to silicon carbide, the semiconductor source material can for example also be made of silicon, gallium arsenide GaAs, gallium nitride GaN, silicon carbide SiC, indium phosphide InP, zinc oxide ZnO, aluminum nitride AlN, germanium, gallium (III) oxide $Ga_2O_3$, aluminum oxide $Al_2O_3$ (sapphire), gallium phosphide GaP, indium arsenide InAs, indium nitride InN, aluminum arsenide AlAs or diamond.

The solid body or the workpiece (e.g. wafer) preferably comprises a material or a combination of materials from one of the main groups 3, 4 and 5 of the periodic table of elements, such as SiC, Si, SiGe, Ge, GaAs, InP, GaN, $Al_2O_3$ (sapphire), AlN. Being particularly preferred, the solid body comprises a combination of elements from the fourth, third and fifth group of the period table of occurring elements. Conceivable materials or combinations of materials include gallium arsenide, silicon, silicon carbide, etc. Furthermore, the solid body can comprise a ceramic (e.g. $Al_2O_3$— aluminum oxide) or be made of a ceramic, preferential ceramics include perovskite ceramics (such as Pb, O-, Ti/Zr-containing ceramics) in general and lead-magnesium niobate, barium titanate, lithium titanate, yttrium aluminum garnet, especially yttrium aluminum garnet crystals for solid-body laser applications, SAW ceramics (surface acoustic wave), such as lithium niobate, gallium orthophosphate, quartz, calcium titanate, etc. in particular. The solid body thereby preferably comprises a semiconductor material or a ceramic material or, being particularly preferred, the solid body is made of at least one semiconductor material or a ceramic material. The solid body is preferably an ingot or a wafer. Being particularly preferred, the solid body has to do with a material, which is at least partially transparent for laser beams. Thereby, it is furthermore conceivable that the solid body comprises a transparent material or is partially made of or produced from a transparent material, such as sapphire for example. Other materials, which can come into question here as a solid-body material alone or in combination with another material include for example "wide band gap" materials, InAlSb, high-temperature superconductors, in particular, rare earth cuprates (e.g. $YBa_2Cu_3O_7$). In addition, or as an alternative, it is conceivable that the solid body is a photomask, wherein, preferably, each photomask material and, particularly preferably, combinations thereof that are known up to the day of application can be used as a photomask material in the present case. Furthermore, as an addition or as an alternative, the solid body can additionally comprise silicon carbide (SiC) or be made of it.

The modifications can be a phase transformation of silicon carbide into silicon and carbon.

The laser application according to the embodiments described herein preferably causes a material specific locally resolved accumulation of the energy input, or by a defined tempering of the solid body results at defined location or at defined locations as well as at a defined time. In a specific application, the solid body can be made of silicon carbide, whereby, preferably, a strongly locally limited tempering of the solid body to a temperature of for example more than 2,830+/−40° C. is carried out. This tempering results in new substances or phases, in particular, crystalline and/or amorphous phases, wherein the resulting phases are preferably Si-(silicon) and DLC (diamond-like carbon) phases that arise having a significantly reduced strength. Due to this strength-reduced layer, the detachment region or the detachment plane results.

Furthermore, the previously mentioned task is solved by means of a solid body, which is created according to a previously mentioned method and comprises at least one detachment plane in the interior space of the solid body, wherein the detachment plane is formed from modifications, which have been created by means of laser radiation. Furthermore, the solid body comprises a region resulting from a high-temperature treatment method.

In accordance with another preferred embodiment, the layer(s) and/or component(s) are arranged or produced at the region. As an alternative, the layer(s) and/or component(s) can be arranged or produced on a surface of the solid-body layer to be separated. The solid body preferably has a thickness or average thickness of less than 1,000 μm, in particular, less than 800 μm or 700 μm or 600 μm or 500 μm or 400 μm or 300 μm or 200 μm or 100 μm or 80 μm or 50 μm.

An object of the embodiments described herein is thereby also the creation of components on such a pre-treated/modified wafer and the modified wafer as a component substrate itself.

In addition, or as an alternative, the present embodiments described herein refers to such a multi-component arrangement. The multi-component arrangement is preferably created by means of a method described in this property rights document and, being particularly preferred, comprises at least one solid-body layer. The solid-body layer consists of more than 50% (in terms of mass), in particular, more than 75% (in terms of mass) or more than 90% (in terms of mass) or more than 95% (in terms of mass) or more than 98% (in terms of mass) or more than 99% (in terms of mass) SiC, wherein the solid-body layer comprises modifications or modification components generating pressure tensions in the region of a first surface, wherein the modifications are amorphized (phase-transformed) components of the solid-body layer, wherein the modifications are spaced closer to the first surface or form this than to a second surface, wherein the second surface is formed in parallel or is essentially in parallel to the first surface, wherein the first surface is level or essentially level and/or wherein the second surface is level or is essentially level. Furthermore, the multi-component arrangement also comprises a metal layer created on the first surface of the solid-body layer. Furthermore, it is possible that one or a plurality of further layers and/or one or a plurality of other components are arranged on the second surface, in particular, for forming electrical components, which can be used as horizontal or vertical components.

Preferably, the creation of a composite structure also takes place by arranging or producing layers and/or components on or above an initially exposed surface of the solid body, wherein the exposed surface is an integral part of the solid-body layer to be separated. Preferably, the modifications to form the detachment plane are created before creating the composite structure. Furthermore, one external force can be introduced into the solid body for creating tensions within the solid body, wherein the external force is so strong that the tensions cause a crack propagation along the detachment plane.

Preferably, the modifications are spaced away at less than 200 μm, in particular, less than 150 μm or less than 110 μm or less than 100 μm or less than 75 μm or less than 50 μm from the second surface.

Preferably, a surface is viewed as being essentially level, if each square centimeter of the surface at least makes contact with the ideally smooth and ideally level surface at least with one component when lying the surface and ideally smooth and ideally level surface.

Preferably, a surface is viewed as being level, if each square centimeter of the surface, in particular square millimeters, at least makes contact with the ideally smooth and ideally level surface at least with a plurality of components, in particular with at least two, three, four or five components when lying the surface and ideally smooth and ideally level surface.

Furthermore, the object of the patent application DE 10 2016 123 679.9 filed with the German Patent and Trademark Office on Dec. 7, 2016 is made complete by reference to the object of the present property rights document.

Other advantages, objectives and features will be explained based on the following description of the enclosed drawings, in which a separation method is shown as an example. Components or elements, which are preferably used in the method according to the embodiments described herein and/or which, in the figures, at least essentially coincide with regard to their function, can be identified using the same reference numbers, wherein these components or elements do not have to be numbered or explained in all figures.

BRIEF DESCRIPTION OF THE DRAWINGS

The figures show:
FIG. 1a-f a treatment sequence;
FIG. 2a-b two schematic examples of solid-body arrangements;
FIG. 4 a schematic illustration of two lines formed by modifications;
FIG. 5a-d various cooling devices that are preferably usable for cooling within the scope of a method;
FIG. 6a-c three different schematic examples for the crack propagation between modifications;
FIG. 7 differently oriented modification lines for initializing different functions;
FIG. 8 an example of a Schottky diode.

DETAILED DESCRIPTION

Figure 3A:
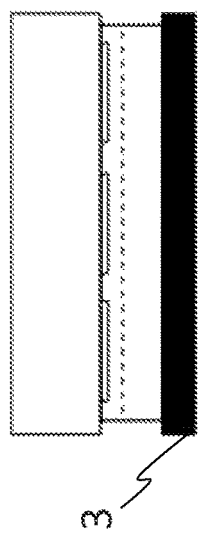
FIG. 3a-i other schematic examples for solid-body arrangements and solid body arrangements that can be produced within the scope of a method, as an intermediate product.

FIG. 1a shows the provision of a solid body 1, in particular, of a wafer.

In accordance with FIG. 1b, the provided solid body 1 is coupled or glued or welded or screwed or clamped to a tool carrier (chuck) 3, wherein the tool carrier preferably comprises a cooling function and thereby preferably being transformed into a cooling device 3. The solid body 1 is preferably fixed in the longitudinal direction with its underside, which preferably lies in the longitudinal direction opposite to the surface 5, to the cooling device 3, in particular, being glued. The laser beams are thereby introduced into the solid body 1 via the surface 5, which is an integral part of the solid-body layer to be separated, for creating modifications 9 in the direction of the cooling device 3. Being particularly preferred, furthermore, a high-temperature treatment of the surface 5 takes place, in particular an epitaxial material arrangement on the solid-body surface 5, thereby preferably resulting in another layer 145 or a plurality of other layers 145. The at least one high-temperature method is preferably an epitaxy method, a doping method or a method under the use of plasma, wherein at least one layer 145 is created on the solid body 1 by means of the high-temperature method, in particular, in the case of an epitaxy method, wherein the at least one produced layer 145 has predefined parameters, wherein at least one predefined parameter specifies a maximum degree of breakage and/or absorption and/or reflection of laser-light waves, wherein the degree of breakage and/or absorption and/or reflection is under 5% and preferably under 1% and, being particularly preferred, under 0.1%. Furthermore, the produced layer 145 or the other produced layers 145 are preferably free of metal.

FIG. 1c schematically shows the creation of modifications 9 by means of the laser beams. The laser beams thereby preferably penetrate into the solid body 1 via a layer 145, which was previously produced by means of the high-temperature method. As an alternative however, it is conceivable that the laser beams penetrate into the solid body 1 via an exposed, meaning a surface of the solid body 1 that is not coated with the other layer 145, in particular from below. Thereby, the solid body 1 is preferably held on the side or on the external ends (width and/or depth direction).

FIG. 1d shows a schematic sectional illustration of the solid body 1 after the creation of the modifications 9. In accordance with this example, four blocks of modifications 9 can be recognized, which lead to the four crack parts 25, 27, 28, 29. Adjacent to the blocks with modifications 9, the reference numbers 41, 42, 43, 44 and 45 each identify regions without modifications 9 or regions, in which fewer modifications 9 are created than in the regions, in which the blocks of modifications 9 are produced.

FIG. 1e shows a state, in accordance with which a receiving layer, in particular, comprising a polymer material, is arranged or produced on other components (not shown) arranged on the surface 5 or on another layer previously epitaxially created on the surface 5. The receiving layer is preferably created as a film and after its creation, coupled to the surface 5, in particular, bonded or glued on. However, it is also possible to form the receiving layer by applying a liquid polymer onto the surface 5 and then allowing it to solidify.

Between the step of creating the modifications and attaching the receiving layer, preferably an arrangement or a creation of other layers 150 and/or components 150 takes place on the surface 5 or on another layer 145 already created on it during an upstream high-temperature method.

FIG. 1f schematically shows a tempering of the receiving layer. The receiving layer is preferably tempered, in particular cooled, to a temperature below the ambient temperature, in particular, to a temperature of less than 20° C., or less than 1° C., or less than 0° C., or less than –10° C., or less than –50° C., or less than –60° C. Wherein the material of the receiving layer 140 experiences a glass transition or a crystallization due to the cooling. Preferably, the tempering of the receiving layer takes place by means of a liquid nitrogen, in particular, by means of a nitrogen vapor. Due to the tempering, in particular, due to the glass transition, the receiving layer contracts, whereby mechanical tensions in the solid body 1 are generated. Due to the mechanical tensions, a crack is initialized that connects the crack portions 25, 27, 28, 29, by means of which the solid-body portion 12 is separated from the solid body 1.

FIG. 2a shows an embodiment, in accordance with which the receiving layer 140 is arranged on a surface of the solid body, which is further spaced away from the modifications than a surface 5 that is parallel or preferably, essentially parallel or completely parallel thereto. Preferably, the surface comprises another layer 145 (analogous to FIG. 1b-1f). Preferably, components 150 or other material layers 150 are arranged on the other layer 145 or on the exposed surface 5. Preferably, a stabilization layer and/or a protective layer 142 is arranged or produced on an exposed surface of the other material layer 150 or the components 150. Thereby, the components 150 can be casted, in particular using a polymer material and/or ceramic material. In addition, it is conceivable that a stabilization device, in particular a further wafer, such as a glass wafer, is coupled to the stabilization layer and/or protective layer 142, in particular, being glued or bonded on. The stabilization layer and/or protective layer 142 or the stabilization layer and/or protective layer 142 and the stabilization device cause that the components 150 or other material layer 150 only deform insignificantly during splitting or after splitting or do not deform at all. When split, the deformation can be caused by the forces generated by the receiving layer 140 and after splitting, deformation can be caused by the remaining modifications, in particular, material conversions. In the case of a material conversion, the modifications cause that pressure forces arise, whereby a bowing of the separated solid-body layer would result without the stabilization layer/stabilization device. In addition, or as an alternative, the stabilization layer 142 can be designed as a glass wafer or, in addition or as an alternative, a glass wafer can be arranged on the stabilization layer 142.

A unit consisting of a separated solid-body layer and a stabilization layer and/or protective layer 142 arranged on it and, possibly, a stabilization device arranged on it, is then preferably further treated to remove stress. Being particularly preferred, the stabilization layer 142 or the stabilization device forms a holding device, by means of which the separated solid-body layer is fixable for a material removal treatment with relation to a material removal device, in particular, a grinding and/or polishing device. By means of the material removal device, the modification portions remaining on the separated solid-body layer are then removed, in particular, removed by machining.

The solid-body layer is preferably always thinner than the remaining solid-body portion. Furthermore, it is conceivable that the receiving layer is not arranged or produced on a surface of the later solid-body layer, but on a surface of the remaining solid-body portion. If the solid-body material is silicon, then, with relation to the remaining solid body, the separated solid-body layer preferably has a level less than 40% of the level of the remaining solid body, in particular, less than 30% or 20% of the level of the remaining solid body. In the case of silicon, preferably, predetermined parameters for the modification creation are provided; the numerical aperture is preferably between 0.5 and 0.8, in particular at 0.65, the radiation depth is between 150 µm and 1000 µm, in particular, at 300 µm, the pulse interval is between 1 µm and 5 µm, in particular at 2 µm, the line spacing is between 1 µm and 5 µm, in particular at 2 µm, the pulse duration is between 50 ns and 400 ns, in particular, at 300 ns and the pulse energy is between 3 µJ and 30 µJ, in particular at 10 µJ.

If the material is SiC, then, with relation to the remaining solid body, the separated solid-body layer preferably has a level less than 50% of the level of the remaining solid body, in particular, less than 45% or 40% or 35% or 30% or 25% of the level of the remaining solid body. In the case of SiC, preferably, predetermined parameters for the modification creation are provided; the numerical aperture is preferably between 0.4 and 0.8, in particular at 0.4, the radiation depth is between 50 µm and 500 µm, in particular, at 180 µm, the pulse interval is between 0.1 µm and 3 µm, in particular, at 1 µm, the line spacing is between 10 µm and 100 µm, in particular, at 75 µm, the pulse duration is preferably between 1 fs and 10 ns, in particular, at 3 ns and the pulse energy is between 0.50 and 30 µJ, in particular at 7 µJ.

Also, in FIG. 2b, analogously to FIG. 1b-1f, another layer 145 can be created, even if this has not been identified. The other material layers or components 150 are therefore preferably created or arranged on the other layer 145 or on an exposed surface of the solid body.

Furthermore, FIG. 2b shows that the receiving layer can be arranged on a surface of the remaining solid body and another receiving layer 146 can be arranged on the components or other material layers 150. Thereby, the components can additionally be provided with a stabilization layer 142, whereby the other receiving layer 146 is preferably arranged or produced on the stabilization layer and/or protective layer 142. The other receiving layer 146 is preferably provided as a film and is preferably also made of at least partially of a polymer material. Being particularly preferred, the other receiving layer 146 comprises the same material as the receiving layer 140 or 142. This embodiment is favorable since the tensions for creating the crack can be introduced into the solid body from two sides.

FIGS. 3a to 3i show different arrangements, which can be provided after creating the other material layers or components 150 for introducing the crack.

FIGS. 3a-3i show diverse solid-body arrangements 176, as they are favorable for inducing crack formation and/or crack initialization tensions.

Here, FIG. 3a shows a processed solid body 1 or wafer with structures or components 150.

Figure 3B:
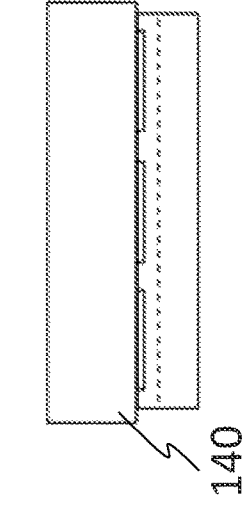

With relation to the solid body 1 shown in FIG. 3a, in the case of the solid body 1 shown in FIG. 3b, a receiving layer 140 is arranged or produced on the component side, in particular, on the components 150 or the other material layers 150. Here, the receiving layer 140 is preferably arranged on the solid-body layer to be separated. Thereby, the receiving layer 140 can also be referred to as split film and is thereby preferably laminated onto the structure side. In the subsequent step, a cooling of the total arrangement takes place, wherein the split and crack initialization and/or crack formation is initialized.

Figure 3C:
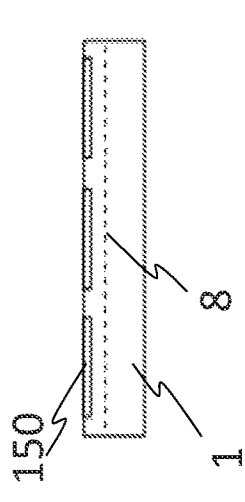

With relation to the illustration in FIG. 3b, in accordance with FIG. 3c, a holding layer/bonded wafer is arranged on the underside of the solid body or on the exposed surface of the solid body. The holding layer can also have to do with a tool carrier or chuck 3. In the subsequent step, a cooling of the total arrangement takes place, wherein the split and crack initialization and/or crack formation is initialized.

Figure 3D:
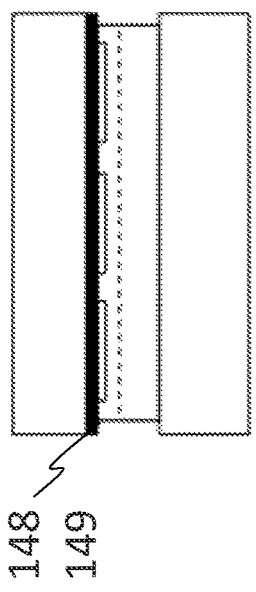

With relation to FIG. 3b, FIG. 3d shows an arrangement, in accordance with which the solid body is provided on both sides with receiving layers 140, 146. The other receiving layer 146 is arranged on a surface of the later remaining residual solid body, wherein an adhesive layer 148 and/or sacrificial layer 149 and/or protective layer 142 can be created or arranged between the other receiving layer 146 and the solid body 1. Both receiving layers 140 and 146 are preferably laminated on. In the subsequent step, a cooling of the total arrangement takes place, wherein the split and crack initialization and/or crack formation is initialized.

Figure 3E:
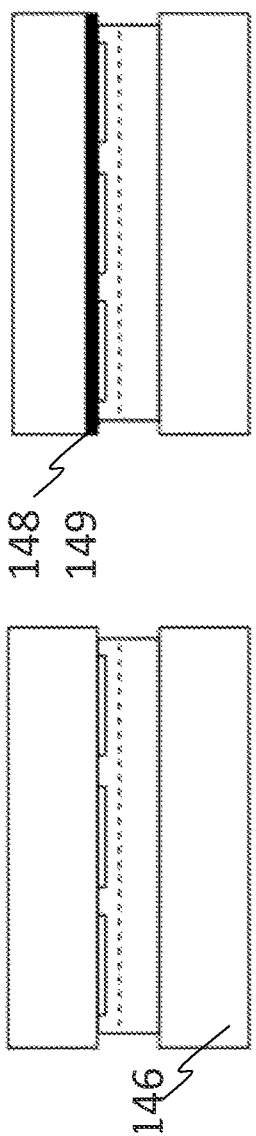

FIG. 3e shows an arrangement, in accordance with which no adhesive layer 148 and/or sacrificial layer 149 and/or protective layer 142 is arranged or produced between the other receiving layer 146 and the solid body 1 with relation to the arrangement known from FIG. 3d. In the subsequent step, a cooling of the total arrangement takes place, wherein the split and crack initialization and/or crack formation is initialized.

Figure 3F:
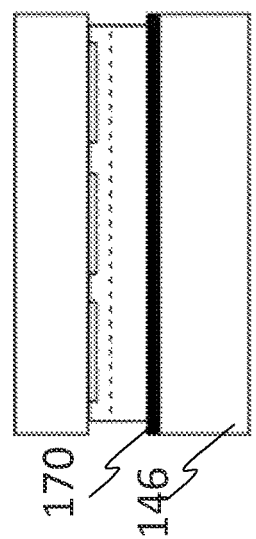

FIG. 3f shows an arrangement that is structured inversely to the arrangement known from FIG. 3d, meaning that the adhesive layer 148 and/or sacrificial layer 149 and/or protective layer 142 is not arranged or produced between the other receiving layer 146 and the solid body 1, but is/are created or arranged between the receiving layer 140 and the solid body 1 and thereby, on the solid-body layer to be separated. On components 150 or the structures, for example, one or a plurality of layers can be created by spin coating for example. As a subsequent step, a cooling of the total arrangement takes place, wherein the split and crack initialization and/or the crack formation is initialized.

Figure 3G:
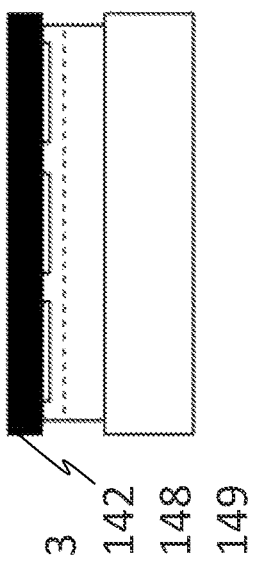

FIG. 3g shows an arrangement or a form, which corresponds to a combination of the arrangements in FIGS. 3d and 3f. The solid body is preferably laminated with split film on both sides, and, similarly, a protective layer and/or adhesive layer and/or sacrificial layer can be provided; furthermore, spin coating is also possible on the structures for example. As a subsequent step, a cooling of the total arrangement takes place, wherein the split and crack initialization and/or the crack formation is initialized.

Figure 3H:
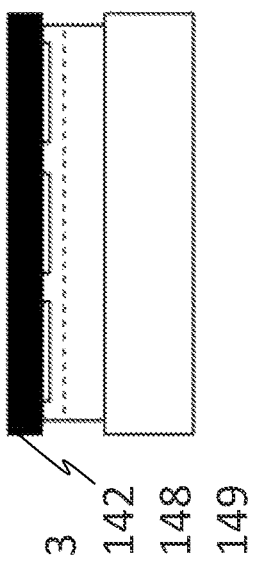

FIG. 3h shows an arrangement, which is similar to the arrangement shown in FIG. 3b, wherein the receiving layer is not arranged or laminated on a surface of the solid-body layer to be separated, but on one side of the residual solid body remaining after separation. The separation then takes place due to the cooling analogously to the separation of an ingot or like in an ingot process.

Figure 3I:
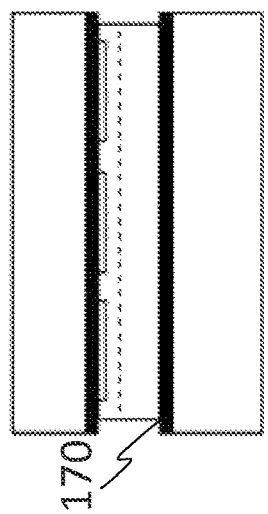

FIG. 3i shows an arrangement, which is similar to the arrangement known from FIG. 3c, wherein one or a plurality of the layers or devices mentioned in the following is/are arranged or produced on the component side of the solid body or under the components 150. These layers or facilities preferably include: At least or exactly one adhesive layer 148 and/or at least or exactly one sacrificial layer 149 and/or at least or exactly one protective layer 142 and/or at least or exactly one stabilization device 3, in particular, a tool carrier or chuck or another wafer. As a subsequent step, a cooling of the total arrangement takes place, wherein the split and crack initialization and/or the crack formation is initialized.

FIG. 4 shows an illustration of an example of a writing pattern in the case of an X-Y processing:

Arrows 170, 172 represent the laser feed direction, the black circles represent the various laser shots or modifications 9, which do not overlap here with their harmful effect within the material. Thereby, it is preferred if the laser initially moves into one direction and creates modifications 9 before it reverses and writes modifications 9 in the second (lower) direction.

FIGS. 5a to 5d show different cooling devices 174. The solid-body arrangements 176 processed in these cooling devices 174 result from the various manifestations and designs described in FIGS. 1a to 3i of the solid bodies 1 provided with one or a plurality of receiving layer(s) 140, 146. The cooling devices 174 shown herein all use a liquefied gas 178 as an initial cooling medium for cooling. This initial cooling medium is either nebulized or vaporized depending on the embodiment. Preferably, the initial cooling medium has to do with liquid nitrogen. Alternative cooling methods, for example, using Peltier elements, are also conceivable and possible.

Thereby, the cooling device 174 is preferably used to cool the receiving layer 140, 146 to a temperature between $-130°$ C. and $-10°$ C., in particular, to a temperature between $-80°$ C. and $-50°$ C.

In accordance with FIG. 5a, the cooling device 174 comprises a nitrogen bath, wherein the receiving layer is positioned at a distance away from the liquid nitrogen held in the nitrogen bath, in particular, by means of an adjustable positioning device 180. Thereby, the solid-body arrangement is preferably arranged on a positioning device or on a holder over the nitrogen bath. This results in a temperature gradient above the chamber height and the temperature at the solid-body arrangement can be adjusted via the filling height with the initial cooling medium or the position of the solid-body arrangement 176 (spacing from the bottom of the chamber).

In accordance with the embodiments in FIGS. 5b to 5d, the cooling device preferably comprises a nebulizing means, in particular, at least or exactly one perforated pipeline for nebulizing liquid nitrogen or a nebulizing means for nebulizing liquid nitrogen and the cooling effect is created by means of nebulized or vaporized nitrogen.

In accordance with FIG. 5b, preferably, a homogeneous spraying device/nebulizer for spraying or nebulizing is provided. Spraying or nebulizing preferably takes place above the solid-body arrangement 176. Furthermore, preferably, temperature measurements for temperature control take place, which output the output data for regulating a valve, in particular, a nitrogen valve. The temperature measurements preferably take place on the substrate or on the solid body 1 or on the receiving layer 140.

The substrate or the solid body 1 or the solid-body arrangement 176 preferentially rests over the chamber bottom in order to avoid nitrogen settling at the bottom of the chamber.

In accordance with FIG. 5c, preferably, a perforated pipeline is used as a homogeneous spraying device. Furthermore, preferably, temperature measurements for temperature control take place, which output the output data for regulating a valve, in particular, a nitrogen valve. The temperature measurements preferably take place on the substrate or on the solid body 1 or on the receiving layer 140.

The substrate or the solid body 1 or the solid-body arrangement 176 preferentially rests over the chamber bottom in order to avoid nitrogen settling at the bottom of the chamber.

In accordance with FIG. 5d, a cooling device 176 shows a homogeneous spraying device/nebulizer 182 for the cooling of preferably a plurality of sides or each side. Furthermore, preferably, temperature measurements for temperature control take place, which output the output data for regulating a valve, in particular, a nitrogen valve. The temperature measurements preferably take place on the substrate or on the solid body 1 or on the receiving layer 140.

The substrate or the solid body 1 or the solid-body arrangement 176 preferentially rests over the chamber bottom in order to avoid nitrogen settling at the bottom of the chamber.

The chamber 184 of the cooling device 174 is preferably sealed in order to reduce a temperature gradient as much as possible by means of insulation.

FIG. 6 shows three examples for preferred correlations between the crystal lattice orientation and the modification creation. In particular, this method is useful for the separation of solid-body layers from a solid body comprising SiC or made of SiC. Due to these correlations, another method results. This other method is preferably used to separate at least one solid-body layer 4 from at least one solid body 1, in particular, from a wafer of an ingot or for thinning a wafer. Thereby, the other method preferably comprises at least the steps: Creating a multitude of modifications 9 by means of laser beams in the interior space of the solid body 1 in order to form a detachment plane 8, and introducing an external force into the solid body 1 for generating tensions within the solid body 1, wherein the external force is so strong that the tensions cause a crack propagation along the detachment plane 8.

According to an embodiment, the modifications are successively created in at least one line or row, wherein the modifications 9 made in a line or row are preferably created at a spacing X and with a height H so that a crack extending between two consecutive modifications, in particular, a crack extending in the crystal lattice direction, the crack propagation direction of which is aligned at an angle W to the detachment plane, connects both modifications to one another. The angle W is preferably between 0° and 6°, in particular, at 4°. Preferably, the crack extends from a region under the center of a first modification towards a region above the center of a second modification. The essential connection here is that the size of the modification can or must be changed depending on the spacing of the modifications and of the angle W.

Furthermore, this method can also entail the step of producing a composite structure by arranging or producing layers and/or components 150 on or above an initially exposed surface 5 of the solid body 1, wherein the exposed surface 5 is preferably an integral part of the solid-body layer 4 to be separated. Being particularly preferred, the modifications for forming the detachment plane 8 are created before creating the composite structure.

In order to introduce the external force, analogously to the previously described method, a receiving layer 140 can be arranged on an exposed surface 5 of the composite structure or of the solid body.

The three FIGS. 6a to 6c are intended to illustrate how the size of the damage/modification zone amorphized/phase-transformed by the laser influences height having passed through the saw tooth pattern of the crack. In general, the crack extends along the crystal planes, meaning between individual atoms of the crystal. In the modified zone, these clear planes are no longer existent, so it comes to a stop.

Due to a preferably highest numerical aperture possible, the damage zone can be made smaller along the beam direction as well as laterally on the focal plane. Since only the threshold intensity has to be achieved, a smaller pulse energy level is also sufficient here.

If the damage zone is formed to be smaller in a suitable way, the laser modifications can be set more densely, which allows the saw tooth to run more briefly and, overall, a lower height extension of the modified plane results (first image).

If, in contrast, the damage zone is larger (higher energy and/or lower numerical aperture—FIG. 6b)—the increased pressure of the amorphized zone also initializes a greater microcrack, which is made possible to catch (i.e. to stop in a controlled manner) with a damage zone with a greater extension at a greater spacing.

FIG. 6c ultimately shows the danger if the damage zone is not sufficiently large and too far-reaching cracks are initialized by laser modification, the cracks run too far on the one hand—meaning the difference in height caused by the cracks becomes greater than desired—and, on the other hand, the cracks drift under the other damage zones and are not stopped by the amorphized material. This then leads to material losses again since all cracked material layers must be removed for the final product or for laser processing again.

FIG. 7 shows a schematically presented snapshot from another method. This other method is preferably used to separate at least one solid-body layer 4 from at least one solid body 1, in particular, to separate a wafer from an ingot or for thinning a wafer. Thereby, the other method preferably comprises at least the steps: Creating a multitude of modifications 9 by means of laser beams in the interior space of the solid body 1 in order to form a detachment plane 8, and introducing an external force into the solid body 1 for generating tensions within the solid body 1, wherein the external force is so strong that the tensions cause a crack propagation along the detachment plane 8.

At a first step, the modifications are created on a line 103 and preferably being at the same spacing to one another. Furthermore, it is conceivable that plurality of these lines created at the first step are created. Being particularly preferred, these first lines are created to be parallel to the crack propagation direction and, preferably to be straight or circularly arched in shape, in particular on the same plane. After creating these first lines, second lines 105 are preferably created to propagate and/or instigate preferably subcritical cracks. These second lines are also preferably created to be straight. Being particularly preferred, the second lines are inclined in relation to the first lines, in particular, being orthogonally oriented. The second lines preferably extend on the same plane as the first lines or, being particularly preferred, on a plane that is parallel to the plane, in which the first lines extend. Then, third lines are preferably created for connecting subcritical cracks.

In particular, this method is useful for the separation of solid-body layers from a solid body comprising SiC or made of SiC.

Furthermore, the modifications can be successively created in at least one line or row, wherein the modifications 9 made in a line or row are preferably created at a spacing X and with a height H so that a crack extending between two consecutive modifications, in particular, a crack extending in the crystal lattice direction, the crack propagation direction of which is aligned at an angle W to the detachment plane, connects both modifications to one another. The angle W is preferably between 0° and 6°, in particular, at 4°. Preferably, the crack extends from a region under the center of a first modification towards a region above the center of a second modification. The essential connection here is that the size of the modification can or must be changed depending on the spacing of the modifications and of the angle W.

Furthermore, this method can also entail the step of producing a composite structure by arranging or producing layers and/or components 150 on or above an initially exposed surface 5 of the solid body 1, wherein the exposed surface 5 is an integral part of the solid-body layer 4 to be separated. Being particularly preferred, the modifications for forming the detachment plane 8 are created before creating the composite structure.

In order to introduce the external force, analogously to the previously described method, a receiving layer 140 can be arranged on an exposed surface 5 of the composite structure or of the solid body.

Thereby during the further course of the laser method, lines that are parallel to the crack propagation direction (preferably referred to as transverse lines) are created on SiC (or also other materials) in order to define a plane for the preferred crack initialization before longitudinal lines cause the cracks. Here, the cracks are initially transversely initialized, then longitudinally before a final step sets lines between the longitudinal lines of the second step in order to initialize the cracks across the entire surface. This makes shorter cracking paths possible, which minimizes the final surface roughness. Sample image for cross lines (with the sawtooth) and crack propagation lines (on the sawtooth crests).

FIG. 8 shows a Schottky diode 200 as an example. Thereby, this diode 200 preferably comprises a solid-body layer 4, which, in turn, comprises portions modified by means of laser radiation, in particular, modifications 9. The modifications 9 are thereby created in the proximity of a first surface of the solid-body layer 4. Thereby, a metal layer 20 is created on this first surface of the solid-body layer 4, in particular by means of a sputtering or a chemical deposition. The solid-body layer 4 comprises a second surface with relation to the first surface, on which another layer 145 is produced, in particular, by means of an epitaxy method. The solid-body layer 4 is thereby preferably made of a highly doped SiC or comprises a highly doped SiC and the produced layer 145 is preferably made of a weakly doped SiC or comprises weakly doped SiC. Weak-doped means preferably less doped than highly doped. Thereby, the produced layer 145 preferably comprises less doping than the solid-body layer 4 for each volume unit. Reference number 150 indicates a Schottky contact.

Figure 9:
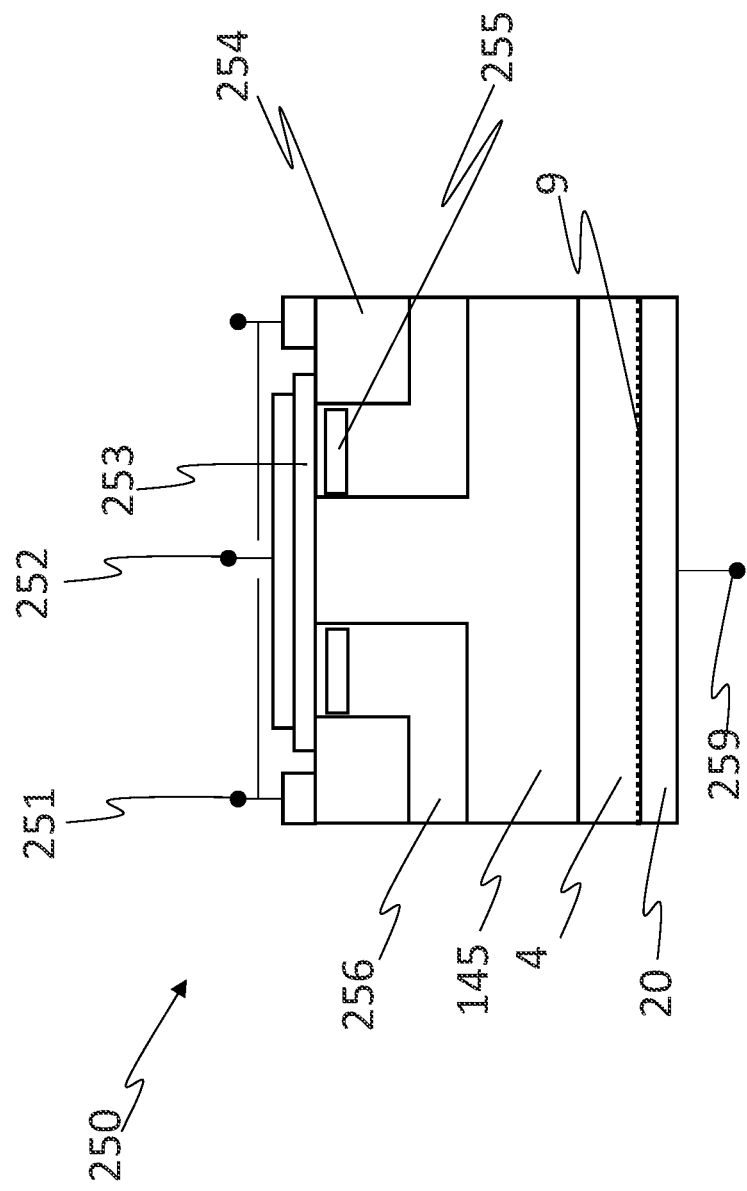
FIG. 9 an example of a MOSFET and
FIG. 10a-b the production of depressions extending into the interior space of the solid body from the edge, wherein the depressions preferably extend along a detachment plane defined by modifications 9.

FIG. 9 shows the structure of a MOSFET 250. This MOSFET 250 thereby preferably comprises a solid-body layer 4, which, in turn comprises portions modified by means of laser radiation, in particular, modifications 9. The modifications 9 are thereby created in the proximity of a first surface of the solid-body layer 4. Thereby, a metal layer 20 is created on this first surface of the solid-body layer 4, in particular by means of a sputtering or a chemical deposition. The metal layer 20 thereby forms a drain (high) via a connection 259. The solid-body layer 4 comprises a second surface with relation to the first surface. On the second surface, another layer, in particular n-type SiC is formed, in particular, being produced or arranged. Reference number 256 indicates another material or element, in particular p-type SiC. Reference number 254 stands for n+. Reference number 255 preferably indicates one or a plurality of channels, in particular, for conducting electrical current. The layer indicated with reference number 253 is preferably made of SiO$_2$ or comprises such. Reference number 251 indicates a source (low) and reference number 252 indicates a gate.

The embodiments described herein can thereby relate to a method for providing at least one solid-body layer 4, wherein the solid-body layer 4 is separated from a solid body 1. Thereby, the method preferably comprises the steps:

Creating a plurality of modifications 9 by means of laser beams within the interior space of the solid body 1 to form a detachment plane 8, wherein, pressure tensions within the solid body 1 are generated by means of the modifications 9, separation of the solid-body layer 4 by means of the separation of the remaining solid body 1 and of the solid-body layer 4 along the detachment plane 8 formed by the modifications 9, wherein at least components of the modifications 9 generating the pressure tensions remain on the solid-body layer 4, wherein so many modifications 9 are created that the solid-body layer 4 separates from the solid body 1 due to the modifications 9 or wherein an external force is introduced into the solid body 1 for generating other tensions within the solid body 1, wherein the external force is so strong that the tensions cause a crack propagation along the detachment plane 8 formed by the modifications, production of a material layer, in particular, a metal layer, on the surface exposed by the separation of the solid-body layer 4 from the solid body 1 for the at least partial and, preferably predominate and, being particularly preferred, full compensation of a deformation of the solid-body layer 4 caused by the pressure tensions of the remaining modification components or for the at least partial and preferably predominate or full compensation of the pressure tensions.

As an alternative, the embodiments described herein can refer to a method for producing electrical components. This method preferably comprises the steps: creating a plurality of modifications 9 by means of laser beams within the interior space of a solid body 1 to form a detachment plane 8, wherein, pressure tensions within the solid body 1 are generated by means of the modifications 9, producing a composite structure by arranging or producing layers and/or components 150 on or above an initially exposed surface 5 of the solid body 1, wherein the exposed surface 5 is an integral part of the solid-body layer 4 to be separated, separation of the solid-body layer 4 by means of the separation of the remaining solid body 1 and of the solid-body layer 4 along the detachment plane 8 formed by the modifications 9, wherein at least components of the modifications 9 generating the pressure tensions remain on the solid-body layer 4, wherein so many modifications 9 are created that the solid-body layer 4 separates from the solid body 1 due to the modifications 9 or wherein an external force is introduced into the solid body 1 for generating other tensions within the solid body 1, wherein the external force is so strong that the tensions cause a crack propagation along the detachment plane 8 formed by the modifications, production of a metal layer 20 on the surface exposed by the separation of the solid-body layer 4 from the solid body 1 for the at least partial and, preferably, predominate and, being particularly preferred, full compensation of the pressure tensions caused by modification components.

Figure 10B:
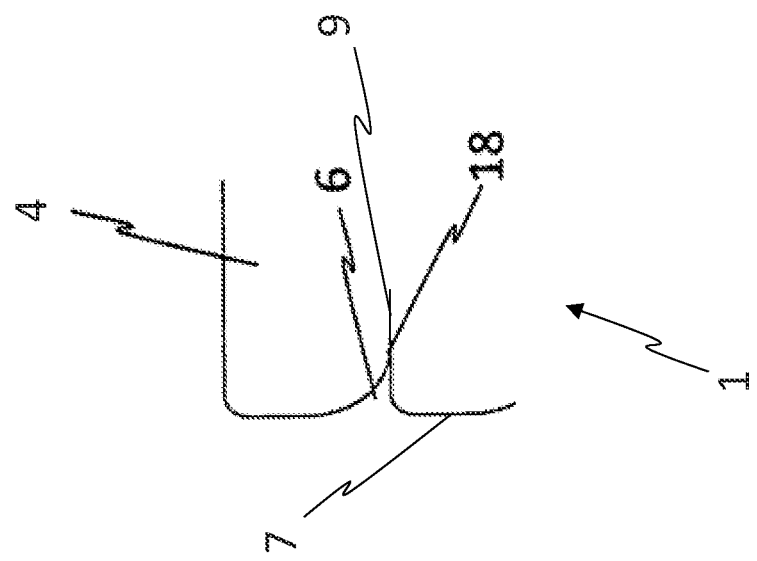
Figure 10A:
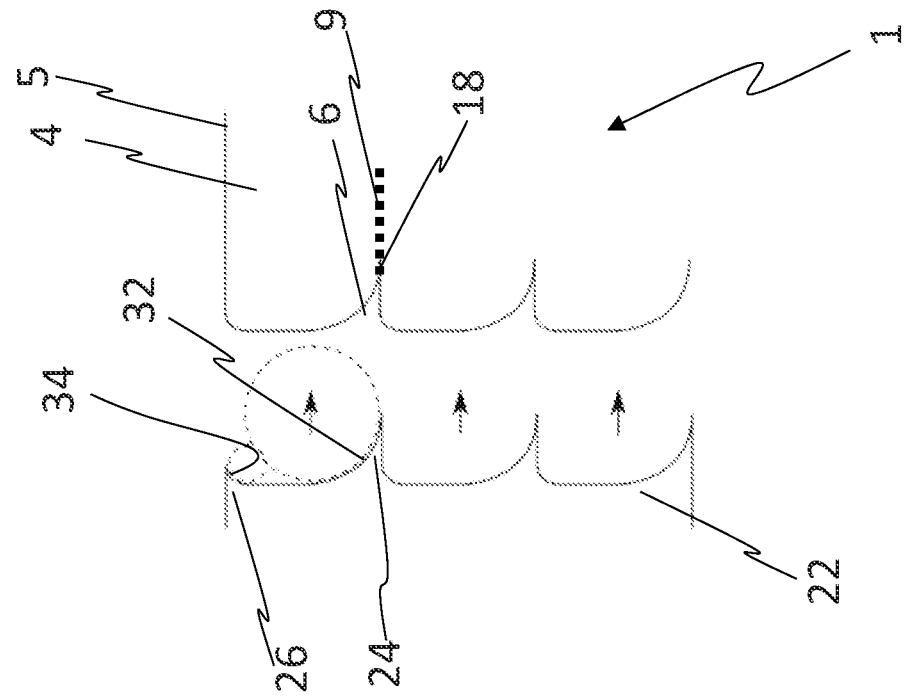

FIG. 10a shows an illustration, which shows a grinding tool 22 with a certain contour. If a level, straight or bent portion is spoken of with reference to the grinding tool, then a portion of the shown contour is always understood with this. Naturally, the grinding tool 22 can be designed, for example, as a rotary grinding tool, whereby the portions abutting the contour in the circumferential direction would preferably extend in a bent manner in the circumferential direction. The grinding tool 22 shown in the first illustration in FIG. 10a comprises a first processing portion 24, which comprises a bent main grinding surface 32 and comprises a second processing portion 26, which comprises a bent secondary grinding surface 34, wherein the radius of the main grinding service 32 is greater than the radius of the secondary grinding surface 34; preferably, the radius of the main grinding surface 32 is at least double, three times, four times or five times as big as the radius of the secondary grinding surface 34.

Thereby, in addition or as an alternative, a method for separating at least one solid-body layer 4, in particular, a solid-body disk or solid-body layer, is provided by a donor substrate 1 or solid body. Thereby, this method preferably comprises the steps:

Providing a donor substrate 1, creating modifications 9 within the interior space of the donor substrate 1 by means of LASER beams, wherein a detachment region is specified by the modifications 9, along which a separation of the solid-body layer from the donor substrate 1 takes place, removal of the material of the donor substrate 1 starting from a surface extending in the circumferential direction of the donor substrate 1 towards the center (Z) of the donor substrate 1, in particular, for producing a circumferential depression, wherein the detachment region 8 or a detachment plane is exposed due to the material removal, separation of the solid-body layer 4 from the donor substrate 1, wherein the donor substrate is weakened in the detachment region by the modifications in such a way that the solid-body layer 4 detaches from the donor substrate 1 due to the material removal or, after material removal, such a number of modifications 9 are created that the donor substrate 1 is weakened in the detachment region in such a way that the solid-body layer 4 detaches from the donor substrate 1 or a tension generation layer 140 or receiving layer is produced or arranged on a surface of the donor substrate 1 that is aligned towards the circumferential surface in an inclined manner, particularly being level, and mechanical tensions are generated within the donor substrate 1 by a thermal application of the tension generation layer 140, wherein a crack results for separating a solid-body layer 4 due to the mechanical tensions, which spreads starting from the surface of the donor substrate exposed due to the material removal along the modifications 9. Here, it is possible that the modifications 9 are partly or completely created before the material removal or after the material removal. The depression 6 thereby preferably becomes narrower in the direction of the center Z towards a depression end 18. Preferably, the depression extends in a wedge shape, wherein the depression end 18 is preferably precisely on the plane, in which the crack expands or in which the modifications 9 are created. Furthermore, it is possible that a composite structure is created by arranging or producing layers and/or components 150 on or above an initially exposed surface 5 of the solid body 1, wherein the exposed surface 5 is an integral part of the solid-body layer 4 to be separated. Being particularly preferred, the modifications 9 for forming the detachment plane 8 are created before creating the composite structure.

After creating the composite structure, introducing an external force into the solid body 1 preferably takes place for generating tensions within the solid body 1, wherein the external force is so strong that the tensions cause a crack propagation along the detachment plane 8.

FIG. 10b shows an illustration, in accordance with which the modifications 9 shown in FIG. 10a, which, in particular, show amorphous portions of the crystal lattice, were treated by etching. Thereby, preferably an etching treatment of non-crystalline components of the solid body 1 takes place while the crystalline components of the solid body are not changed or not essentially changed by the etching treatment. Thereby, the effect is taken advantage of that etching methods can be selectively adjusted to crystalline—non-crystalline regions. Reference number 19 thereby indicates a region, in which the solid-body layer 4 is separated from the remaining residual solid body by means of an etching treatment of modifications 9. This solution is favorable since the mechanical crack opening is led deeper into the crystal by means of etching or etching on. This creates a more precisely defined crack start. Preferably, it applies that the thinner and the deeper the depression or the notch extends into the interior space of the solid body, the better it is with regard to the surface quality of a surface exposed due to a splitting of the solid-body layer. The etching parameters are chosen in such a way that non-amorphous parts, in particular a possibly polished top 5 and/or the unmodified edge 7 are not etched. Thereby, the method can be supplemented by the step of an etching treatment or etching removal of the modifications 9 specifying the detachment region at least in sections for example, in particular with regard to the method described in FIG. 10a. The solid body 1, in particular prior to the creation of a composite structure, is preferably made of SiC or comprises SiC; preferably, the solid body comprises at least 95% (in terms of mass) or at least 99% (in terms of mass) or at least 99.99% (in terms of mass) SiC.

Furthermore, it is pointed out that the material removal on the edge of the solid body, in particular with the subsequent etching step, can be added in the case of each method disclosed with this property rights document.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-component arrangement, comprising:
   a solid-body layer comprising more than 50% SiC and modifications or modification components generating pressure tensions in a region of a first surface, the modifications or modification components being amorphized or phase-transformed components of the solid-body layer, the modifications or modification components being spaced closer to the first surface than to a second surface opposite the first surface, the first surface being level; and
   a metal layer on the first surface of the solid-body layer, wherein the pressure tensions cause a bowing deformation of the solid-body layer,
   wherein the metal layer at least partly compensates for the pressure tensions.

2. The multi-component arrangement of claim 1, wherein the metal layer forms an ohmic contact and/or an interface for heat dissipation.

3. The multi-component arrangement of claim 1, wherein on average, per $cm^2$ of the first surface, at least 4 electrical components are produced.

4. The multi-component arrangement of claim 1, further comprising one or a plurality of further layers and/or one or a plurality of other components arranged on the second surface.

5. The multi-component arrangement of claim 4, wherein the one or a plurality of further layers and/or the one or a plurality of other components arranged on the second surface form vertical or horizontal electrical components.

6. The multi-component arrangement of claim 5, wherein the metal layer forms an ohmic contact for the vertical or horizontal electrical components.

7. The multi-component arrangement of claim 5, wherein the metal layer forms a drain connection for the vertical or horizontal electrical components.

8. The multi-component arrangement of claim 4, wherein the plurality of other components are Schottky diodes and/or transistors.

9. The multi-component arrangement of claim 4, wherein the second surface of the solid-body layer has a coating and the one or a plurality of further layers and/or the one or a plurality of other components is arranged on the coating.

10. The multi-component arrangement of claim 4, further comprising a polymer material on the one or a plurality of further layers and/or the one or a plurality of other components.

11. The multi-component arrangement of claim 1, wherein the metal layer comprises titanium, titanium tungsten, nickel, platinum $TaSi_2$ and/or gold.

12. The multi-component arrangement of claim 1, wherein the modifications or modification components are a phase transformation of silicon carbide into silicon and carbon.

13. The multi-component arrangement of claim 1, wherein the modifications or modification components are a phase transformation of silicon carbide into silicon and diamond-like carbon phases.

14. The multi-component arrangement of claim 1, wherein the solid-body layer comprises a material or a combination of materials from one of the main groups 3, 4 and 5 of the periodic table of elements.

15. The multi-component arrangement of claim 1, wherein the solid-body layer comprises SiC, Si, SiGe, Ge, GaAs, InP, GaN, $Al_2O_3$, or AlN.

16. The multi-component arrangement of claim 1, wherein the solid-body layer comprises a ceramic.

* * * * *